(12) United States Patent
Kawabata

(10) Patent No.: US 7,675,800 B2
(45) Date of Patent: Mar. 9, 2010

(54) SEMICONDUCTOR MEMORY, MEMORY CONTROLLER, SYSTEM, AND OPERATING METHOD OF SEMICONDUCTOR MEMORY

(75) Inventor: Kuninori Kawabata, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 177 days.

(21) Appl. No.: 12/038,844

(22) Filed: Feb. 28, 2008

(65) Prior Publication Data
US 2008/0225619 A1  Sep. 18, 2008

(30) Foreign Application Priority Data
Mar. 16, 2007  (JP) .............. 2007-068682

(51) Int. Cl.
*G11C 7/00* (2006.01)
(52) U.S. Cl. .............. 365/222; 365/230.03; 365/236
(58) Field of Classification Search .............. 365/236
See application file for complete search history.

(56) References Cited

U.S. PATENT DOCUMENTS

| | | | |
|---|---|---|---|
| 5,469,559 A * | 11/1995 | Parks et al. | 711/106 |
| 5,566,119 A * | 10/1996 | Matano | 365/222 |
| 6,298,413 B1 * | 10/2001 | Christenson | 711/106 |
| 6,611,470 B2 * | 8/2003 | Hidaka | 365/222 |
| 6,834,021 B2 * | 12/2004 | Mori et al. | 365/222 |
| 2001/0043499 A1 | 11/2001 | Komura et al. | |
| 2008/0285370 A1 * | 11/2008 | Okuyama | 365/222 |

FOREIGN PATENT DOCUMENTS

JP  2003-173676 A  6/2003

* cited by examiner

*Primary Examiner*—Tan T. Nguyen
(74) *Attorney, Agent, or Firm*—Arent Fox LLP

(57) ABSTRACT

When a main block address held in a memory refresh address counter coincides with an access block address corresponding to an access request, its counter value is transferred to a sub refresh address counter. Thereafter, a sub refresh address counter operates with priority over a main refresh address counter until its counter value reaches a final value. Consequently, an access operation and a refresh operation can be simultaneously executed without interfering with each other. As a result, it is possible to execute the refresh operation with a minimum increase in circuit scale and without any deterioration in access efficiency.

33 Claims, 22 Drawing Sheets

SEMICONDUCTOR MEMORY, MEMORY CONTROLLER, SYSTEM, AND OPERATING METHOD OF SEMICONDUCTOR MEMORY

CROSS-REFERENCE TO RELATED APPLICATION

This application is based upon and claims the benefit of priority from Japanese Patent Application No. 2007-068682, filed on Mar. 16, 2007, the entire contents of which are incorporated herein by reference.

BACKGROUND

1. Field

The application relates to a semiconductor memory having dynamic memory cells, and a memory controller and a system accessing the semiconductor memory.

2. Description of the Related Art

In recent years, pseudo SRAMs are increasingly mounted on portable equipments such as mobile phones. The pseudo SRAM is a semiconductor memory having memory cells of a DRAM (dynamic memory cells) and internally and automatically executes a refresh operation of the memory cells to operate as a SRAM. The pseudo SRAM executes the refresh operation without a controller such as a CPU recognizing it, during a period in which a read operation or a write operation is not executed. The refresh operation is executed in response to an internal refresh request periodically generated in the pseudo SRAM.

In a semiconductor memory of this type, when the internal refresh request conflicts with an external access request, one of the refresh operation and an access operation is executed first and thereafter the other of the refresh operation and the access operation is executed. In order to prevent the refresh operation from being recognized by an external part, a refresh operation time taken to execute a refresh operation once is included in an external access cycle time, for instance. In this method, the external access time becomes long, resulting in lowered access efficiency.

With the object to execute the refresh operation without an external part recognizing it and without any deterioration in access efficiency, there has been proposed a semiconductor memory storing a parity code together with write data (for example, Japanese Laid-open Patent Publication No. 2003-173676). In this semiconductor memory, the use of the parity code makes it possible to regenerate read data without reading data from a memory block in which the refresh operation is underway. Further, since an external access request and an internal refresh operation do not conflict with each other, there is no need to include the refresh operation time in the access cycle time. This prevents an increase in the external access time, resulting in improved access efficiency.

However, the use of the parity code necessitates a memory block for storing the parity code, a parity generation circuit, an error correction circuit, and so on. This increases a circuit scale to greatly increase a chip size of the semiconductor memory.

SUMMARY

According to one aspect of an embodiment of the present invention, a semiconductor memory is provided that comprises a plurality of banks each having dynamic memory cells and operating independently, and operates in response to an access request, the semiconductor memory comprising: a main refresh address counter changing a main block address when the main block address coincides with an access block address corresponding to the access request, and sequentially generating a main row address and the main block address in synchronization with a main count signal; a sub refresh address counter set valid when the main block address coincides with the access block address, receiving, as a sub block address and a sub row address, the main block address and the main row address transferred from the main refresh address counter, sequentially generating the sub row address in synchronization with a sub count signal, and set invalid after outputting a final sub row address; an address selection circuit selecting addresses not coinciding with the access block address, out of the main block address and the main row address, and the sub block address and the sub row address, and outputting the selected addresses; a counter control circuit outputting, in response to a refresh request, one of the main count signal and the sub count signal corresponding to the addresses output by the address selection circuit; a refresh counter control circuit controlling operations of the main refresh address counter, the sub refresh address counter, the address selection circuit, and the counter control circuit, and making the sub refresh address counter operate with priority over the main refresh address counter during a period in which the sub refresh address counter is valid; and an operation control circuit executing an access operation of one of the banks in response to the access request and executing a refresh operation of one of the banks in response to the refresh request.

BRIEF DESCRIPTION OF THE DRAWINGS

FIG. 6 illustrates an example of operations of the semiconductor memory of the first embodiment.

FIG. 7 illustrates another example of the operations of the semiconductor memory of the first embodiment.

FIG. 20 illustrates an example of operations of the memory controller of the sixth embodiment.

DETAILED DESCRIPTION OF THE EMBODIMENTS

Figure 1:
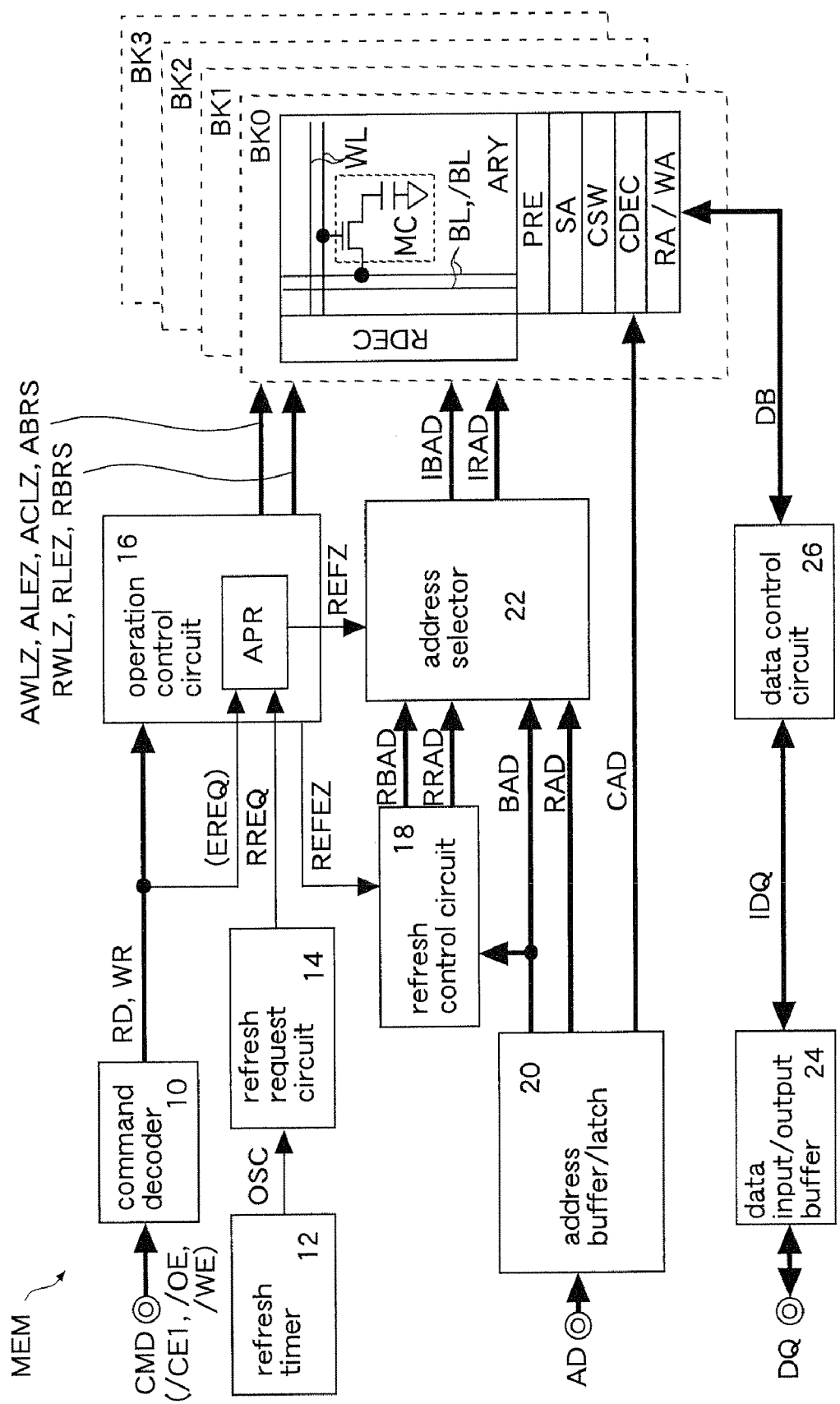
FIG. 1 illustrates a semiconductor memory of a first embodiment.

Hereinafter, embodiments will be described, using the drawings. In the drawings, each signal line shown by the heavy line is constituted of a plurality of lines. Part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 illustrates a semiconductor memory MEM of a first embodiment. The semiconductor memory MEM is, for example, a pseudo SRAM type FCRAM (Fast Cycle RAM). The pseudo SRAM has memory cells of a DRAM and an interface of a SRAM, and internally and automatically executes a refresh operation in a chip. It should be noted that this embodiment is applicable to both clock asynchronous type and clock synchronous type semiconductor memories.

Figure 2:
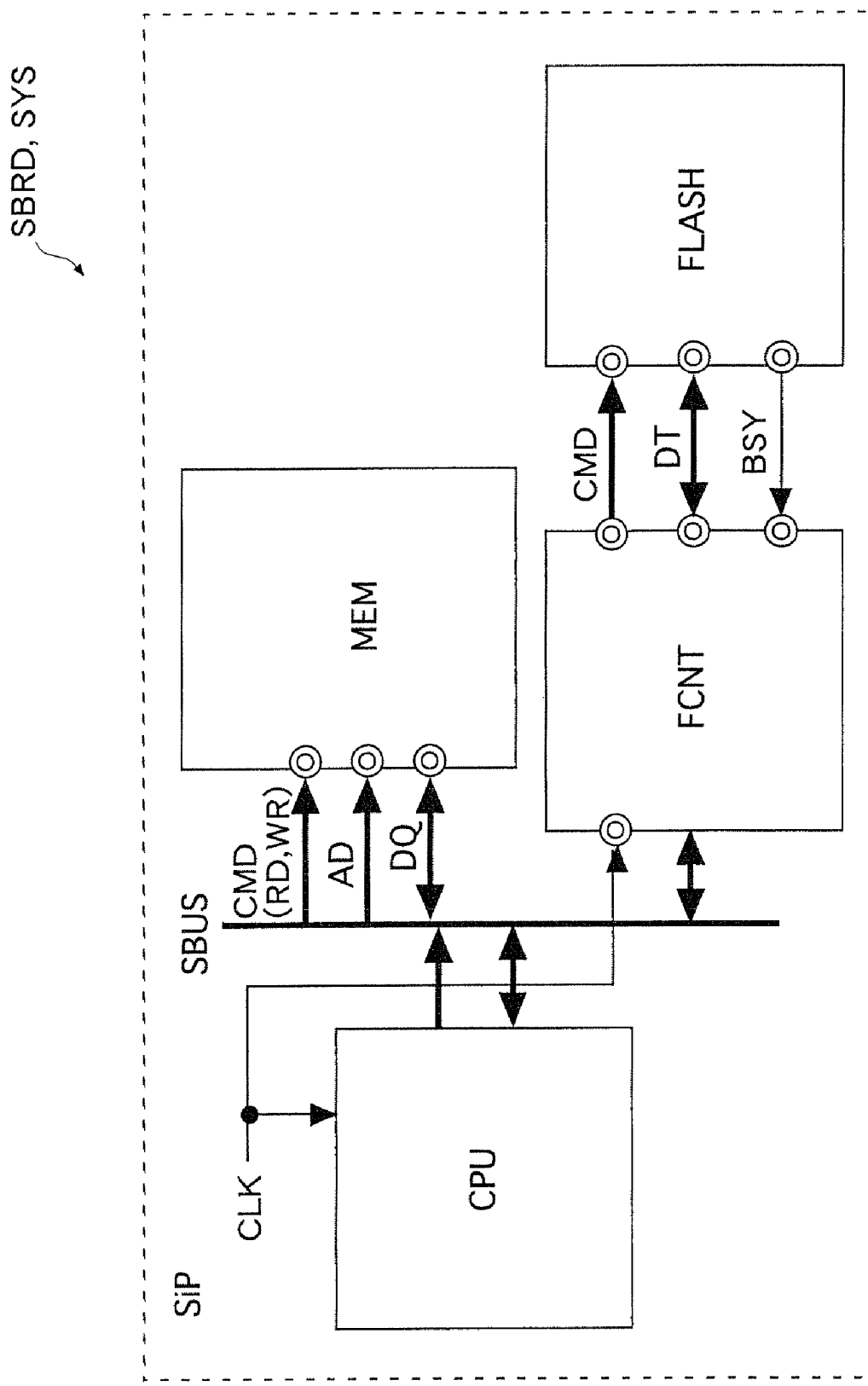
FIG. 2 illustrates a system of the first embodiment.

The memory MEM has a command decoder 10, a refresh timer 12, a refresh request circuit 14, an operation control circuit 16 having an access priority circuit APR, a refresh control circuit 18, an address buffer/latch 20, an address selector 22, a data input/output buffer 24, a data control circuit 26, and four banks BK (BK0-BK3; memory blocks) capable of operating independently of each other. The memory MEM together with a CPU forms a memory system SYS as illustrated in FIG. 2.

The command decoder 10 receives a command signal CMD for executing an access operation of each of the banks BK0-3 and outputs a command recognized according to logical level of the command signal CMD, as a read command signal RD, a write command signal WR, or the like. The read command signal RD and the write command signal WR are external access requests EREQ for executing an access operation to each of the banks BK0-3. For example, the command signal CMD includes a chip enable signal /CE1, an output enable signal /OE, and a write enable signal /WE.

The refresh timer 12 has an oscillator outputting an oscillating signal OSC at a predetermined cycle. The refresh request circuit 14 divides a frequency of the oscillating signal OSC to periodically generate a refresh request signal RREQ (internal refresh request). The refresh timer 12 and the refresh request circuit 14 operate as a refresh request generation circuit periodically outputting the refresh request RREQ.

In response to the read command signal RD or the write command signal WR, the operation control circuit 16 outputs access control signals (a word activation signal AWLZ, a sense amplifier activation signal ALEZ, a column selection signal ACLZ, and a precharge control signal ABRS) in order to cause one of the banks BK0-3 to execute a read operation or a write operation. Further, in response to the refresh request signal RREQ, the operation control circuit 16 outputs refresh control signals (a word activation signal RWLZ, a sense amplifier activation signal RLEZ, and a precharge control signal RBRS) in order to cause one of the banks BK0-3 to execute a refresh operation. The word activation signals AWLZ, RWLZ control the activation timing of word lines WL, and the sense amplifier activation signals ALEZ, RLEZ control the activation timing of sense amplifiers SA. The column selection signal ACLZ controls the on/off timing of column switches CSW, and the precharge control signals ABRS, RBRS control the on/off timing of precharge circuits PRE.

Figure 9:
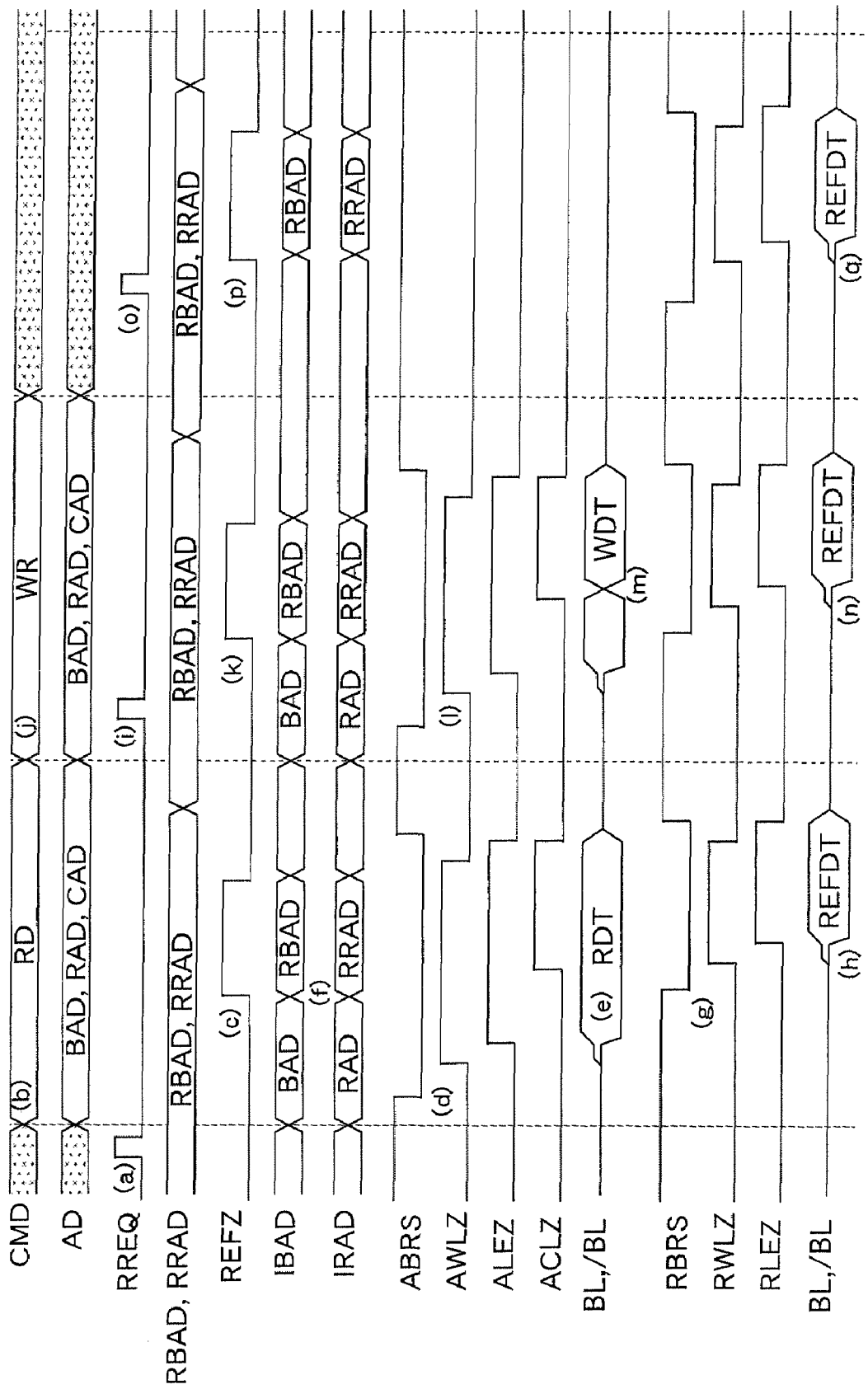
FIG. 9 illustrates operations of banks of the first embodiment.

An access control signal line through which the access control signals AWLZ, ALEZ, ACLZ, ABRS are transmitted to the banks BK0-3 and an access control signal line through which the refresh control signals RWLZ, RLEZ, RBRS are transmitted to the banks BK are laid independently of each other from the operation control circuit 16 to the banks BK. This enables the transmission of the access control signals AWLZ, ALEZ, ACLZ, ABRS to the banks BK, in parallel to the transmission of the refresh control signals RWLZ, RLEZ, RBRS to the banks BK as illustrated in FIG. 9, enabling simultaneous execution of an access operation and a refresh operation in different banks BK.

The access priority circuit APR of the operation control circuit 16 gives priority to the external access request EREQ (the read command RD or the write command WR) when the external access request EREQ and the refresh request RREQ conflict with each other. At this time, a refresh signal REFZ is output at a delayed timing. When the external access request EREQ is given priority, the operation control circuit 16 first outputs part of the access control signals AWLZ, ALEZ, ACLZ, ABRS and thereafter activates the refresh signal REFZ. The refresh control signals RWLZ, RLEZ, RBRS are output in synchronization with the refresh signal REFZ. The operation control circuit 16 outputs a refresh end signal REFEZ (pulse signal) in synchronization with the completion of the refresh operation. Details of operations of the operation control circuit 16 are illustrated in FIG. 9.

The refresh control circuit 18 has a pair of counters (MRAC and SRAC in FIG. 3) counting up in synchronization with the refresh end signal REFEZ. The refresh control circuit 18 makes one of the counters MRAC, SRAC count up according to a block address signal BAD (access block address) and outputs counter values held by one of the counters MRAC, SRAC, as a refresh block address signal RBAD and a refresh row address signal RRAD. Incidentally, the counters MRAC, SRAC may operate in synchronization with the refresh signal REFZ (the start of the refresh operation) instead of the refresh end signal REFEZ. The counters MRAC, SRAC may be down counters instead of the up counters. Details of the refresh control circuit 18 will be described in FIG. 3.

The address buffer/latch 20 receives an address signal AD via an external terminal to output the received address as the block address signal BAD, a row address signal RAD, and a column address signal CAD. The block address signal BAD (two bits in this example) is supplied for the selection from the banks BK0-3. The row address signal RAD is supplied for the selection from the word lines WL. The column address signal CAD is supplied for the selection from a plurality of pairs of bit lines BL, /BL corresponding to a data terminal DQ having a plurality of bits.

The address selector 22 selects the refresh block address signal RBAD and the refresh row address signal RRAD while the refresh signal REFZ is active, in order to execute the refresh operation, and selects the block address signal BAD and the row address signal RAD while the refresh signal REFZ is inactive, in order to execute the read operation or the write operation. The address selector 22 outputs the selected signals as an internal block address signal IBAD and an internal row address signal IRAD to the banks BK0-3.

The data input/input buffer 24 receives a write data signal via the data terminal DQ to output the received data signal as an internal data signal IDQ. Further, the data input/output buffer 24 receives a read data signal from the memory cells MC to output the received data signal to the data terminal DQ. During the write operation, the data control circuit 26 serial-to-parallel-converts the internal data signal IDQ (write data) to output the resultant to a data bus DB. During the read operation, the data control circuit 26 parallel-to-serial-converts the read data on the data bus DB to output the resultant read data as an internal data signal IDQ. For example, a bit width of the data bus DB is twice as large as a bit width of the data terminal DQ (the data terminal DQ with a 16 bit width and the data bus with a 32 bit width).

Each of the banks BK0-3 has a memory cell array ARY, a row decoder RDEC, the precharge circuit PRE, the sense amplifier SA, the column switch CSW, a column decoder CDEC, a read amplifier RA, and a write amplifier WA. The memory cell array ARY has the plural dynamic memory cells MC, the plural word lines WL each coupled to the memory cells MC arranged in one direction, and the plural bit line pairs BL, /BL each coupled to the memory cells MC arranged in a direction perpendicular to the one direction. Each of the memory cells MC has a capacitor for holding data as an electric charge and a transfer transistor for coupling one end of the capacitor to the bit line BL (or /BL). The other end of the capacitor is coupled to a precharge voltage line. A gate of the transfer transistor is coupled to the word line WL. In response to the selection of the word line WL, one of the read operation, the write operation, and the refresh operation is executed.

The row address decoder RDEC decodes the internal row address signal IRAD in order to select one of the word lines WL. The precharge circuit PRE couples the bit line pair BL, /BL to the precharge voltage line in synchronization with the precharge control signal ABRS when the memory cells MC are not accessed. The sense amplifier SA amplifies a difference in signal amount between data signals read to the bit line pair BL, /BL. The column address decoder CDEC decodes the column address signal CAD in order to select the bit line pair to/from which the data signal is to be input/output. The column switch CSW couples the bit lines BL, /BL corresponding to the column address signal CAD to the read amplifier RA or the write amplifier WA. At the time of a read access operation, the read amplifier RA amplifies the complementary read data output via the column switch CSW. At the time of a write access operation, the write amplifier WA amplifies the complementary write data supplied via the data bus DB to supply the amplified write data to the bit line pair BL, /BL.

FIG. 2 illustrates the system SYS of the first embodiment. The system SYS is, for example, a portable equipment such as a mobile phone and has a system board SBRD on which a SiP (System in Package) for controlling the operation of the portable equipment is mounted. The SiP has the memory MEM illustrated in FIG. 1, a flash memory FLASH, a flash controller FCNT accessing the flash memory FLASH, a CPU (system controller) controlling the whole system, and so on. The CPU, the memory MEM, and the flash controller FCNT are mutually coupled via a system bus SBUS. The SiP may be coupled to an upper-order system via an external bus.

In this system SYS, a program and data stored in the flash memory FLASH are transferred to the memory MEM upon power-on. Thereafter, in order to realize functions of the system SYS, the CPU executes the program transferred to the memory MEM to read the data held in the memory MEM or to write data to be held in the memory MEM. In order to continuously read the program, the program is held dispersedly in the banks BK0-3, for instance. Therefore, low-order bits of an address signal output by the CPU are allocated to the banks BK0-3.

In order to access the memory MEM, the CPU outputs the command signal CMD, the address signal AD, and a write data signal DQ, and receives a read data DQ from the memory MEM. Not outputting a refresh request, the CPU is not capable of recognizing the timing at which the memory MEM executes a refresh operation. That is, the memory MEM automatically executes the refresh operation without the CPU recognizing it.

Figure 3:
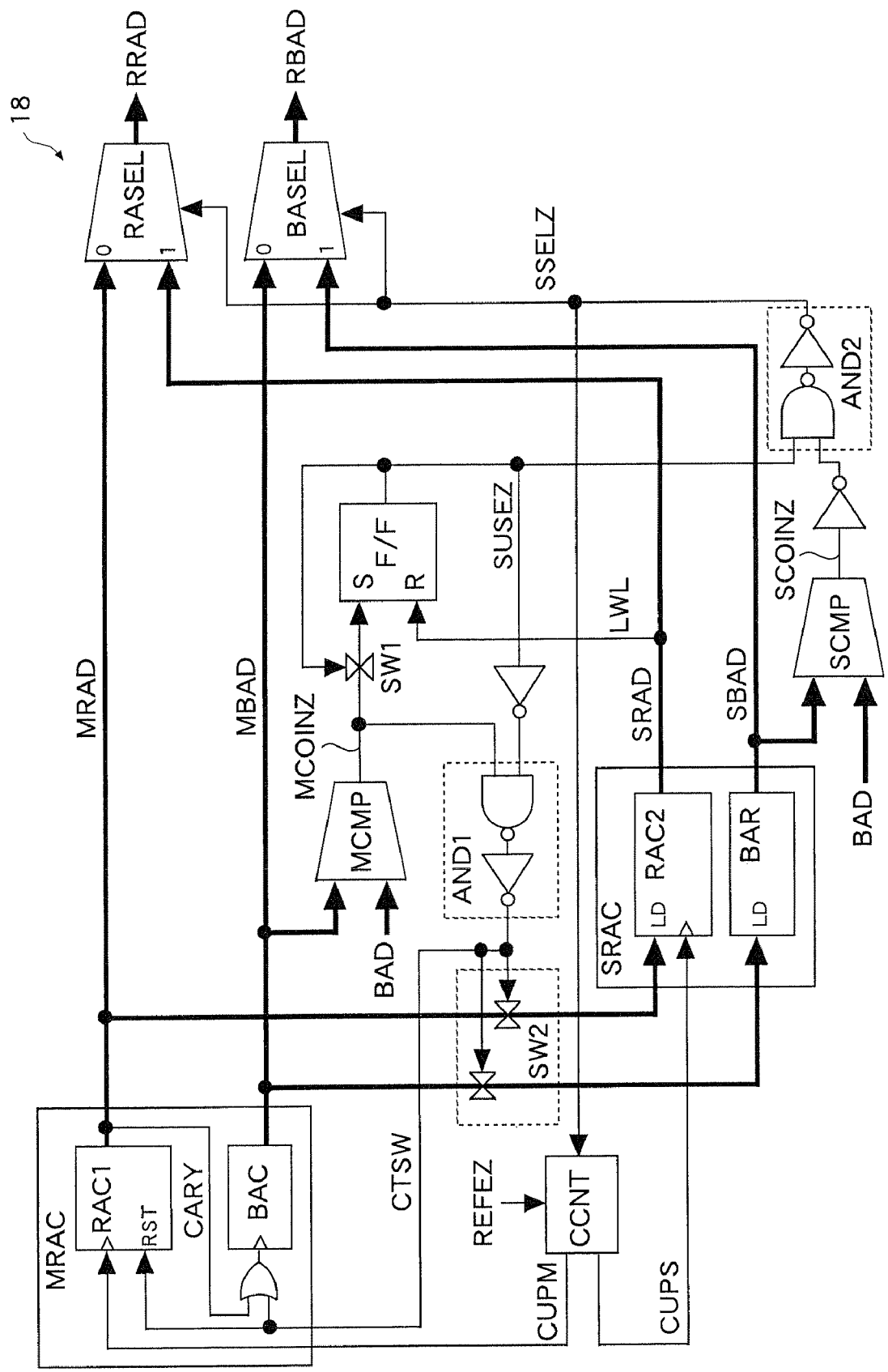
FIG. 3 illustrates details of a refresh control circuit illustrated in FIG. 1.

FIG. 3 illustrates details of the refresh control circuit 18 illustrated in FIG. 1. The refresh control circuit 18 has the main refresh address counter MRAC, the sub refresh address counter SRAC, a main comparator MCMP, a first switch SW1, a RS flip-flop F/F, an AND circuit AND1, a second switch SW2, a counter control unit CCNT, a sub comparator SCMP, an AND circuit AND2, a row address selection circuit RASEL, and a block address selection circuit BASEL. As will be described later, the main comparator MCMP, the first switch SW1, the flip-flop F/F, the AND circuit AND1, the second switch SW2, the sub comparator SCMP, and the AND circuit AND2 control the operations of the main and sub refresh address counters MRAC, SRAC, the address selection circuits RASEL, BASEL, and the counter control circuit CCNT, and operate as a refresh counter control circuit which makes the sub refresh address counter SRAC operate with priority over the main refresh address counter MRAC during a period in which the sub refresh address counter SRAC is valid.

The main refresh address counter MRAC has a main row address counter RAC1 and a main block address counter BAC. The row address counter RAC1 operates in synchronization with a main count up signal CUPM (main count signal) to sequentially increment (update) a main row address signal MRAD (main refresh address signal). When receiving high level of a counter switch signal CTSW at a reset terminal RST, the row address counter RAC1 is reset to zero. The block address counter BAC operates in synchronization with a carry signal CARY or the counter switch signal CTSW to sequentially increment (update) a main block address signal MBAD (main refresh address signal). The carry signal CARY is output when a counter value of the row address counter RAC1 changes from the maximum value to the minimum value (zero).

The sub refresh address counter SRAC has a sub row address counter RAC2 and a sub block address register BAR. The row address counter RAC2 holds, as a counter value, the main block address signal MBAD received at a load terminal LD, when the switch SW2 is on. Further, the row address counter RAC2 operates in synchronization with a sub count up signal CUPS (sub count signal) to sequentially increment (update) a sub row address signal SRAD (sub refresh address signal). When the switch SW2 is on, the block address register BAR holds the main block address signal MBAD received at the load terminal LD to output the held value as a sub block address signal SBAD (sub refresh address signal). The value held in the block address register BAR is not counted up. Not being a counter, the block address register BAR can be formed with a simple circuit.

The main row address signal MRAD and the sub row address signal SRAD are signals for the selection of the word line WL coupled to the memory cells MC to be refreshed. That is, the main row address signal MRAD and the sub row address signal SRAD indicate the memory cells MC to be refreshed. The main block address signal MBAD and the sub block address signal SBAD indicate the bank BK to be refreshed.

The main comparator MCMP compares the main block address signal MBAD with the block address signal BAD supplied with the external access request EREQ, and activates a main coincidence signal MCOINZ high when the block address signals MBAD, BAD coincide with each other. That is, the main coincidence signal MCOINZ is activated when the bank BK in which the refresh operation is to be executed and the bank BK in which the access operation is to be executed are the same.

The first switch SW1 turns on while a sub use signal SUSEZ is inactive (low), and turns off while the sub use signal SUSEZ is active (high). The sub use signal SUSEZ is kept active during a period in which the sub refresh address signals SRAD, SBAD from the sub refresh address counter SRAC are used as the refresh address signals RRAD, RBAD (during a period in which the sub refresh address counter SRAC is used with higher priority). Conversely, the sub use signal SUSEZ is kept inactive during a period in which the main refresh address signals MRAD, MBAD from the main refresh address counter MRAC are used as the refresh address signals RRAD, RBAD (while the main refresh address counter MRAC is used).

The flip-flop F/F activates the sub use signal SUSEZ when receiving, at a set terminal S, the high level of the main coincidence signal MCOINZ supplied via the switch SW1, while deactivating the sub use signal SUSEZ when receiving a last word signal LWL at a reset terminal R. The last word signal LWL is output when the sub row address signal SRAD generated by the row address counter RAC2 changes from the maximum value (final value) to the minimum value (zero=initial value). That is, the last word signal LWL is output in response to the completion of the output of the final sub row address signal SRAD. Incidentally, in order to keep the set terminal S low while the switch SW1 is off, the set terminal S of the flip-flop F/F is pulled down by a resistor element not illustrated.

The AND circuit AND1 changes the counter switch signal CTSW to high when the main coincidence signal MCOINZ is activated while the sub use signal SUSEZ is inactive. That is, the counter switch signal CTSW changes to high when it is detected, while the main refresh address counter MRAC is used, that the bank BK in which the refresh operation is to be executed and the bank BK in which the access operation is to be executed are the same. The switch SW2 turns on during a period when the counter switch signal CTSW is high, in order to transfer the current main refresh address signals MRAD, MBAD held in the main refresh address counter MRAC to the sub refresh address counter SRAC.

The counter control unit CCNT outputs the main count up signal CUPM in synchronization with the refresh end signal REFEZ while a sub address selection signal SSELZ is inactive, and outputs the sub count up signal CUPS in synchronization with the refresh end signal REFEZ while the sub address selection signal SSELZ is active. In other words, the counter control unit CCNT outputs one of the count up signals CUPM and CUPS corresponding to the refresh block address signal RBAD output by the block address selection circuit BASEL, in synchronization with the refresh end signal REFEZ corresponding to the refresh request RREQ. By making the counter MRAC or SRAC operate in synchronization with the completion of the refresh operation, it is possible to generate the next refresh addresses MBAD, MRAD, SRAD at an earlier timing. This can improve an operating margin of the refresh control circuit 18 in the selection operation or the like of the refresh addresses MBAD, MRAD, SBAD, SRAD.

The sub comparator SCMP compares the sub block address signal SBAD with the block address signal BAD supplied with the external access request EREQ, and activates a sub coincidence signal SCOINZ high when the block address signals SBAD, BAD coincide with each other. That is, the sub coincidence signal SCOINZ is activated high when the bank BK in which the refresh operation is to be executed and the bank BK in which the access operation is to be executed are the same. Incidentally, while the sub use signal SUSEZ is inactive, the sub refresh address counter SRAC is set invalid and does not output the valid sub refresh address signals SBAD, SRAD. Therefore, the sub comparator SCMP keeps the sub coincidence signal SCOINZ low while the sub use signal SUSEZ is inactive.

The AND circuit AND2 activates the sub address selection signal SSELZ only when the sub coincidence signal SCOINZ is deactivated while the sub use signal SUSEZ is active, and otherwise, deactivates the sub address selection signal SSELZ. That is, the sub address selection signal SSELZ is deactivated low while the main refresh address counter MRAC is used, or is deactivated low when it is detected, while the sub refresh address counter SRAC is used, that the bank BK in which the refresh operation is to be executed is the same as the bank BK in which the access operation is to be executed. Conversely, the sub address selection signal SSELZ is activated high when it is detected, while the sub refresh address counter SRAC is used, that the bank BK in which the refresh operation is to be executed is different from the bank BK in which the access operation is to be executed.

The row address selection circuit RASEL and the block address selection circuit BASEL output the sub refresh address signals SRAD, SBAD as the refresh address signals RRAD, RBAD while the sub address selection signal SSELZ is active, and output the main refresh address signals MRAD, MBAD as the refresh address signals RRAD, RBAD while the sub address selection signal SSELZ is inactive. In other words, the block address selection circuit BASEL outputs, as the refresh block address signal RBAD, one of the block address signals MBAD and SBAD not coinciding with the block address signal BAD corresponding to the access request EREQ.

Figure 4:
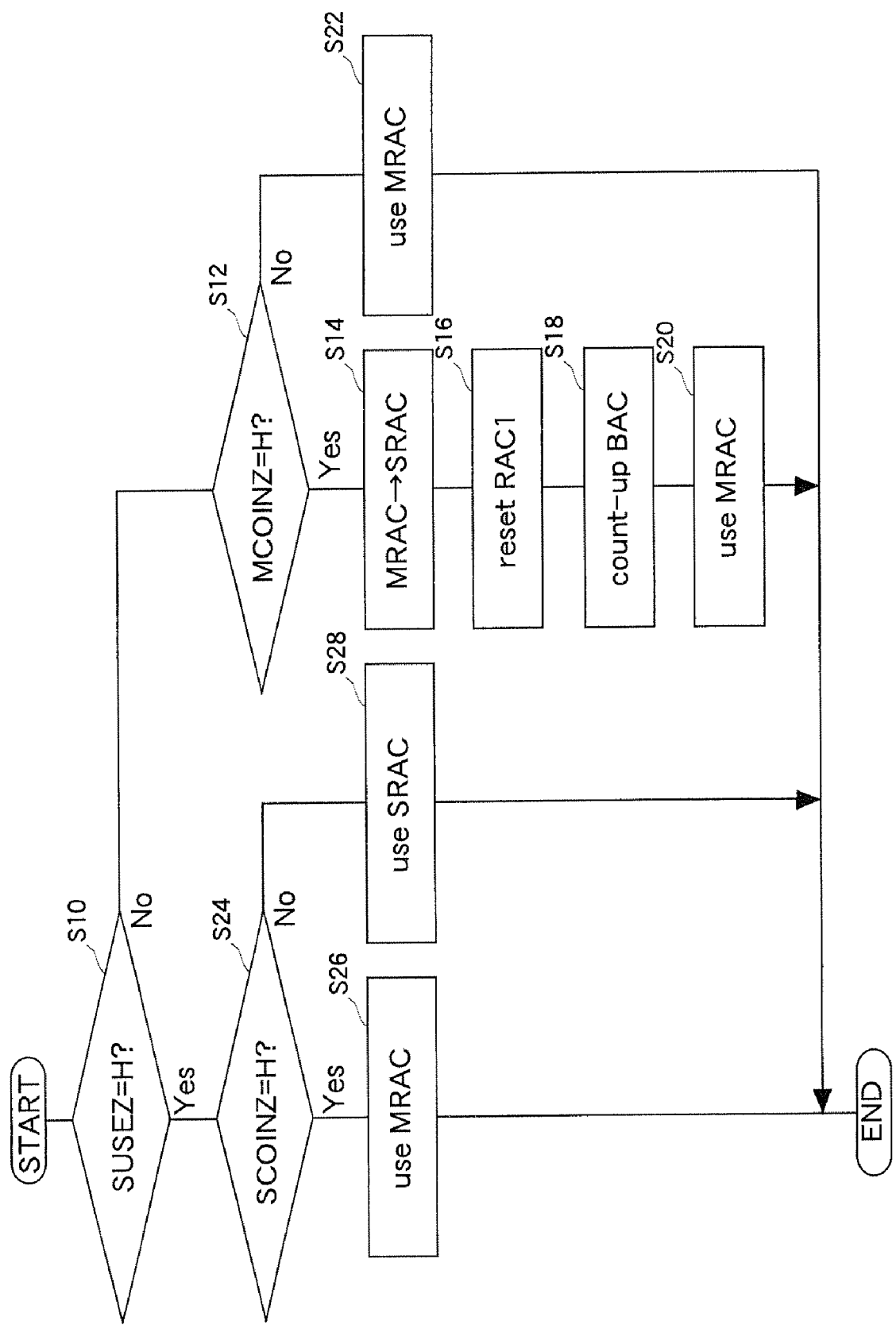
FIG. 4 illustrates an outline of operations of the refresh control circuit illustrated in FIG. 3.

FIG. 4 illustrates an outline of operations of the refresh control circuit 18 illustrated in FIG. 3. The operations in FIG. 4 are executed every time the refresh request RREQ is generated. First, at Step S10, it is determined based on logical level of the sub use signal SUSEZ which one of the refresh address counters MRAC, SRAC is currently used. When the main refresh address counter MRAC is used (SUSEZ=low L), the processing goes to Step S12. When the sub refresh address counter SRAC is used (SUSEZ=high H), the processing goes to Step S24.

At Step S12, it is determined based on logical level of the main coincidence signal MCOINZ whether or not the main block address MBAD and the block address BAD coincide with each other. That is, it is determined whether or not a refresh operation and an access operation conflict with each other in the same bank BK. When they conflict with each other, the processing goes to Step S14 and then Steps S14, S16, S18, and S20 are sequentially executed, and when they do not conflict with each other, the processing goes to Step S22.

At Step S14, values held in the main refresh address counter MRAC are transferred to the sub refresh address counter SRAC. At Step S16, the row address counter RAC1 of the main refresh address counter MRAC is reset to zero. At Step S18, the block address counter BAC counts up. Then, at Step S20, the updated main refresh addresses MRAD, MBAD held in the main refresh address counter MRAC are output as the refresh addresses RRAD, RBAD.

When the refresh operation and the access operation do not conflict with each other, the main refresh addresses MRAD, MBAD held in the main refresh address counter MRAC are output as the refresh addresses RRAD, RBAD at Step S22.

On the other hand, when the sub refresh address counter SRAC is used with higher priority, it is determined at Step S24 whether or not the sub block address SBAD and the block address BAD coincide with each other, based on logical level of the sub coincidence signal SCOINZ. That is, it is determined whether or not the refresh operation and the access operation conflict with each other in the same bank BK. The processing goes to Step S26 when they conflict with each other, while going to Step S28 when they do not conflict with each other.

At Step S26, the main refresh addresses MRAD, MBAD held in the main refresh address counter MRAC are output as the refresh addresses RRAD, RBAD. At Step S28, the sub refresh addresses SRAD, SBAD held in the sub refresh address counter SRAC are output as the refresh addresses RRAD, RBAD. In this manner, the refresh operation is executed by using the values held in the sub refresh address counter SRAC only when the refresh operation and the access operation do not conflict with each other while the sub refresh address counter SRAC is used with higher priority, and otherwise, the refresh operation is executed by using the values held in the main refresh address counter MRAC.

Figure 5:
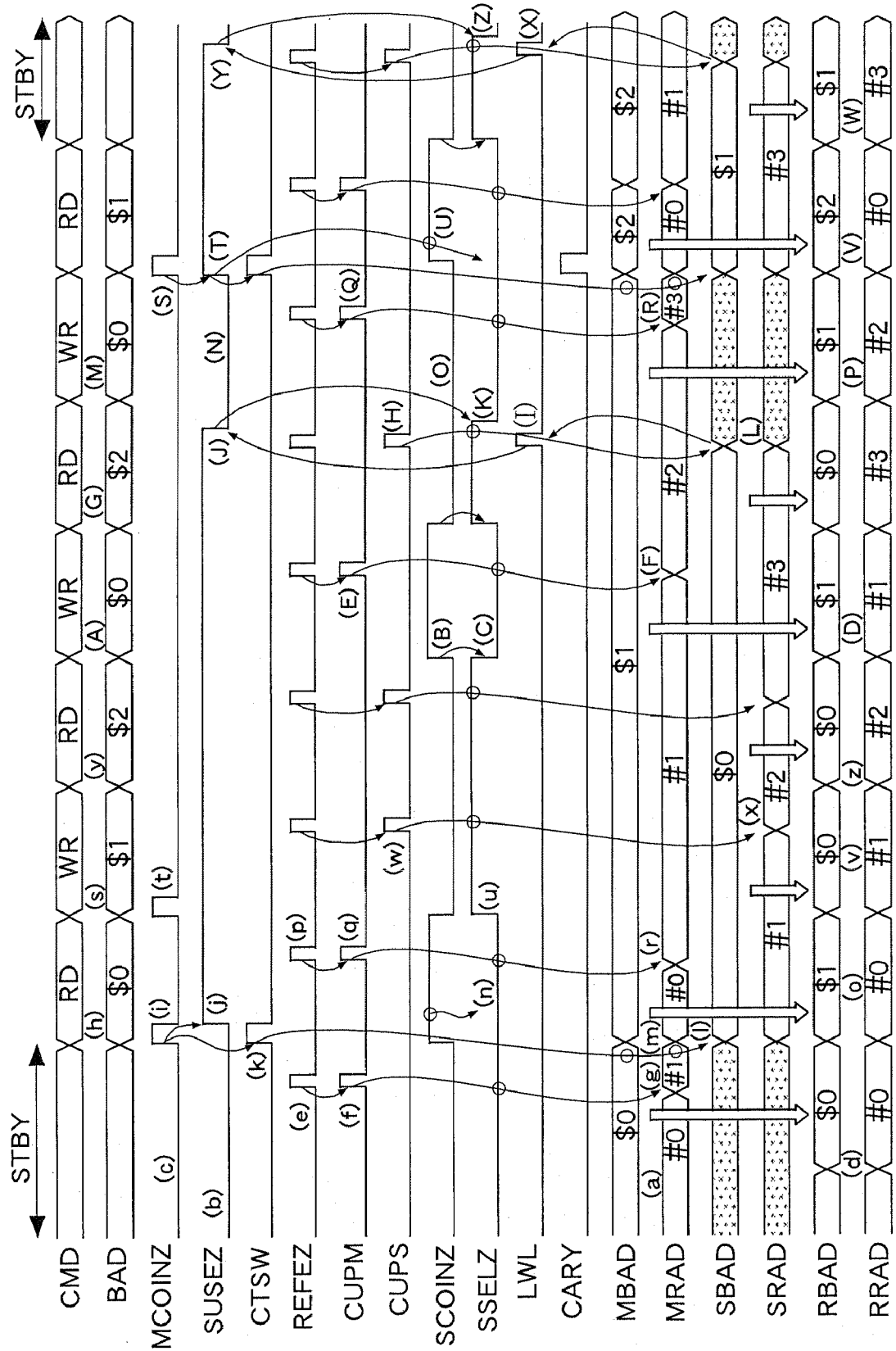
FIG. 5 illustrates details of the operations of the refresh control circuit illustrated in FIG. 3.

FIG. 5 illustrates details of the operations of the refresh control circuit 18 illustrated in FIG. 3. The numerals with "$" represent the numbers assigned to the banks BK0-3 (block addresses), and the numerals with "#" represent the numbers assigned to the word lines WL (row addresses). In this example, description will be given on assumption that each of the banks BK0-3 has four word lines WL0-WL3. That is, each of the row addresses MRAD, SRAD, RRAD has two bits. When the refresh request RREQ and the external access request EREQ do not conflict with each other, the row address MRAD indicating the memory cells MC to be refreshed sequentially increments, so that 0, 1, 2, 3, 0, 1, . . . are cyclically output as the row address MRAD. The block address MBAD sequentially increments every one cycle of the row address MRAD, so that 0, 1, 2, 3, 0, 1 are cyclically output as the block address MBAD. In this example, the memory MEM alternately receives the read commands RD and the write commands WR after the standby period STBY in which the external access request EREQ is not supplied, and then executes read operations and write operations.

For easier understanding of the operations of the refresh control circuit 18, FIG. 5 illustrates an example where all the external access requests EREQ conflict with the refresh requests RREQ (not illustrated). Actually, however, the shortest supply interval of the external access request EREQ is, for example, 100 ns, and the refresh request RREQ is generated every several μs or ten odd μs. Therefore, the generation frequency of the refresh request RREQ is once per several tens of the external access requests EREQ.

At the beginning in FIG. 5, for example, the main refresh address counter MRAC outputs addresses MBAD ($0), MRAD (#0) (FIG. 5 (a)). The flip-flop F/F is initialized upon power-on of the memory MEM (system SYS) to output a low use signal SUSEZ (FIG. 5 (b)). During the standby period STBY, since the refresh request RREQ and the external access request EREQ do not conflict with each other, the block address MBAD for refresh and the block address BAD do not coincide with each other, so that the coincidence signal MCOINZ is kept low (FIG. 5 (c)). The sub address selection signal SSELZ is kept low and the addresses MBAD, MRAD output from the main refresh address counter MRAC are output as the refresh addresses RBAD, RRAD (FIG. 5 (d)).

Then, the memory cells MC coupled to the word line WL0 (#0) of the bank BK0 ($0) are refreshed.

In the memory MEM of this embodiment, when the same bank BK is continuously accessed for a long period according to the product specification, it is necessary to insert the standby period STBY at a predetermined cycle. This insertion enables the insertion of the refresh operation even when the same bank BK is continuously accessed. However, allocating the low-order bits of the address signal output by the CPU to the block address BAD as described in FIG. 2 prevents the continuous access to the same bank BK. Therefore, in a normal system operation, the standby period STBY is not inserted for the refresh operation, which can prevent deterioration in access efficiency. The standby period STBY in FIG. 5 is not a period for the refresh operation but is, for example, a period in which the CPU accesses a device other than the memory MEM.

The refresh end signal REFEZ is output in response to the completion of the refresh operation (FIG. 5 (e)). Since the sub address selection signal SSELZ is low, the main count up signal CUPM is output in synchronization with the refresh end signal REFEZ (FIG. 5 (f)), and the counter value of the main refresh address counter MRAC increments by "1" (FIG. 5 (g)).

Next, the read command RD of the bank BK0 is supplied (FIG. 5 (h)). Since the block address MBAD for refresh and the block address BAD coincide with each other (both are $0), the coincidence signal MCOINZ is output (FIG. 5 (i)). The flip-flop F/F is set in synchronization with the coincidence signal MCOINZ, and the sub use signal SUSEZ is activated high (FIG. 5 (j)). A period during which the sub use signal SUSEZ is high is a valid period in which the sub refresh address counter SRAC can operate. The counter switch signal CTSW changes to high in accordance with the change of the coincidence signal MCOINZ to high and is kept high until the activation of the sub use signal SUSEZ (FIG. 5 (k)). During the period in which the counter switch signal CTSW is high, the switch SW2 turns on and the values of the main refresh address counter MRAC are transferred to the sub refresh address counter SRAC (FIG. 5(l)). The hatched portions of the addresses SBAD, SRAD represent an invalid state where the sub refresh address counter SRAC is not used (SUSEZ=low).

Further, in accordance with the change of the counter switch signal CTSW to high, the counter RAC1 (MRAD) of the main refresh address counter MRAC is reset to zero (#0), and the counter value (MBAD) of the counter BAC is counted up to change to "$1" (FIG. 5 (m)). In this manner, the main refresh address counter MRAC updates the block address MBAD and the row address MRAD in order to change the bank BK to be refreshed, when the held block address MBAD coincides with the block address BAD.

When the addresses MBAD, MRAD are transferred to the sub refresh address counter SRAC, the block address SBAD output from the sub refresh address counter SRAC and the block address BAD supplied with the read command RD always coincide with each other (SCOINZ=high). In response to the high-level sub coincidence signal SCOINZ, the sub address selection signal SSELZ is kept low (FIG. 5 (n)). Then, the addresses MBAD, MRAD output from the main refresh address counter MRAC are output as the refresh addresses RBAD, RRAD, and the memory cells MC coupled to the word line WL0 (#0) of the bank BK1 ($1) are refreshed simultaneously with the read operation of the bank BK0 (FIG. 5 (o)).

During a period in which the sub address selection signal SSELZ is low, the refresh end signal REFEZ is output (FIG.

5 (*p*)), and the main count up signal CUPM is output (FIG. 5 (*q*)). Therefore, the counter value of the main refresh address counter MRAC increments by "1" (FIG. 5 (*r*)). In this manner, the counting by the main refresh address counter MRAC and the sub refresh address counter SRAC and the selection by the address selection circuits RASEL, BASEL are controlled according to the logical level of the sub use signal SUSEZ, which makes it possible to form the refresh control circuit 18 with a simple structure, realizing reduced circuit scale.

Next, the write command WR of the bank BK1 is supplied (FIG. 5 (*s*)). Since the block address MBAD for refresh and the block address BAD coincide with each other, the coincidence signal MCOINZ is output (FIG. 5 (*t*)). However, the switch SW1 is off since the sub use signal SUSEZ is high, and therefore, no operation is performed in response to the coincidence signal MCOINZ. However, since the block address SBAD output from the sub refresh address counter SRAC and the block address BAD supplied with the write command WR do not coincide with each other (SCOINZ=low), the sub address selection signal SSELZ changes to high (FIG. 5 (*u*)). Then, the addresses SBAD, SRAD output from the sub refresh address counter SRAC are output as the refresh addresses RBAD, RRAD, and the memory cells MC coupled to the word line WL1 (#1) of the bank BK0 ($0) are refreshed simultaneously with the write operation of the bank BK1 (FIG. 5 (*v*)). Since the sub address selection signal SSELZ has changed to high, the sub count up signal CUPS is output in synchronization with the refresh end signal REFEZ (FIG. 5 (*w*)), and the counter value of the sub refresh address counter SRAC increments by "1" (FIG. 5 (*x*)).

Next, the read command RD of the bank BK2 is supplied (FIG. 5 (*y*)). Since the block address BAD ($2) is different from the block address SBAD ($0) held in the sub refresh address counter SRAC, the refresh operation is executed by using the addresses SBAD ($0), SRAD (#2) simultaneously with the read operation of the bank BK2, similarly to the above (FIG. 5 (*z*)). Thus, the refresh operation is executed by using the sub refresh address counter SRAC with higher priority when the valid addresses SBAD, SRAD are held in the sub refresh address counter SRAC (that is, SUSEZ=high).

Next, the write command WR of the bank BK0 is supplied (FIG. 5 (A)). Since the block address BAD ($0) is the same as the block address SBAD ($0) held in the sub refresh address counter SRAC, the sub coincidence signal SCOINZ changes to high (FIG. 5 (B)). Consequently, the sub address selection signal SSELZ changes to low (FIG. 5 (C)), and the refresh operation is executed by using the addresses MBAD ($1), MRAD (#1) simultaneously with the write operation of the bank BK0 (FIG. 5 (D)). The main count up signal CUPM is output since the sub address selection signal SSELZ is low (FIG. 5 (E)), and the counter value of the main refresh address counter MRAC increments by "1" (FIG. 5 (F)).

Next, the read command RD of the bank BK2 is supplied (FIG. 5 (G)). Since the block address BAD ($2) is different from the block address SBAD ($0) held in the sub refresh address counter SRAC, the refresh operation is executed by using the addresses SBAD ($0), SRAD (#3) output from the sub refresh address counter SRAC, similarly to the above. At this time, since the sub address selection signal SSELZ is high, the sub count up signal CUPS is output in synchronization with the refresh end signal REFEZ (FIG. 5 (H)). The counter value of the sub refresh address counter SRAC is counted up, and since one cycle of the address SRAD has ended, the last word signal LWL temporarily changes to high (FIG. 5 (I)). Consequently, the flip-flop F/F is reset, and the sub use signal SUSEZ is deactivated (FIG. 5 (J)). In response to the deactivation of the sub use signal SUSEZ, the sub address selection signal SSELZ changes to low (FIG. 5 (K)). Then, the sub refresh address counter SRAC is set invalid (FIG. 5 (L)). During a period in which the sub refresh address counter SRAC is invalid, the block address SBAD is not output, and therefore, the sub comparator SCMP stops its comparison operation. Therefore, the sub coincidence signal SCOINZ is fixed low.

Next, the write command WR of the bank BK0 is supplied (FIG. 5 (M)). Since the block address BAD ($0) is different from the block address MBAD ($1) held in the main refresh address counter MRAC, the main coincidence signal MCOINZ is not output and the flip-flop F/F is not set. Therefore, the sub use signal SUSEZ and the sub address selection signal SSELZ are kept low (FIG. 5 (N, O)). Consequently, the refresh operation is executed by using the addresses MBAD ($1), MRAD (#2) held in the main refresh address counter MRAC (FIG. 5 (P)). Since the sub address selection signal SSELZ is low, the main count up signal CUPM is output (FIG. 5 (Q)), and the counter value of the main refresh address counter MRAC increments by "1" (FIG. 5 (R)).

Next, the read command RD of the bank BK1 is supplied. Since the block address MBAD for refresh and the block address BAD coincide with each other (both are $1), the coincidence signal MCOINZ is output (FIG. 5 (S)). Thereafter, similarly to the above, the flip-flop F/F is set, and the sub use signal SUSEZ is activated high (FIG. 5 (T)). Since the transferred block address MBAD for refresh and the block address BAD coincide with each other, the sub coincidence signal SCOINZ is output (FIG. 5 (U)). Then, the refresh operation is executed by using the addresses MBAD ($2), MRAD (#0) output from the main refresh address counter MRAC (FIG. 5 (V)).

Thereafter, during the standby period STBY, the refresh operation is executed by using the addresses SBAD ($1), SRAD (#3) held in the sub refresh address counter SRAC with higher priority (FIG. 5 (W)). Since one cycle of the address SRAD has ended, the last word signal LWL changes to high similarly to the above (FIG. 5 (X)), and the sub use signal SUSEZ and the sub address selection signal SSELZ change to low (FIG. 5 (Y, X)). Then, the sub refresh address counter SRAC is set invalid.

Figure 6:
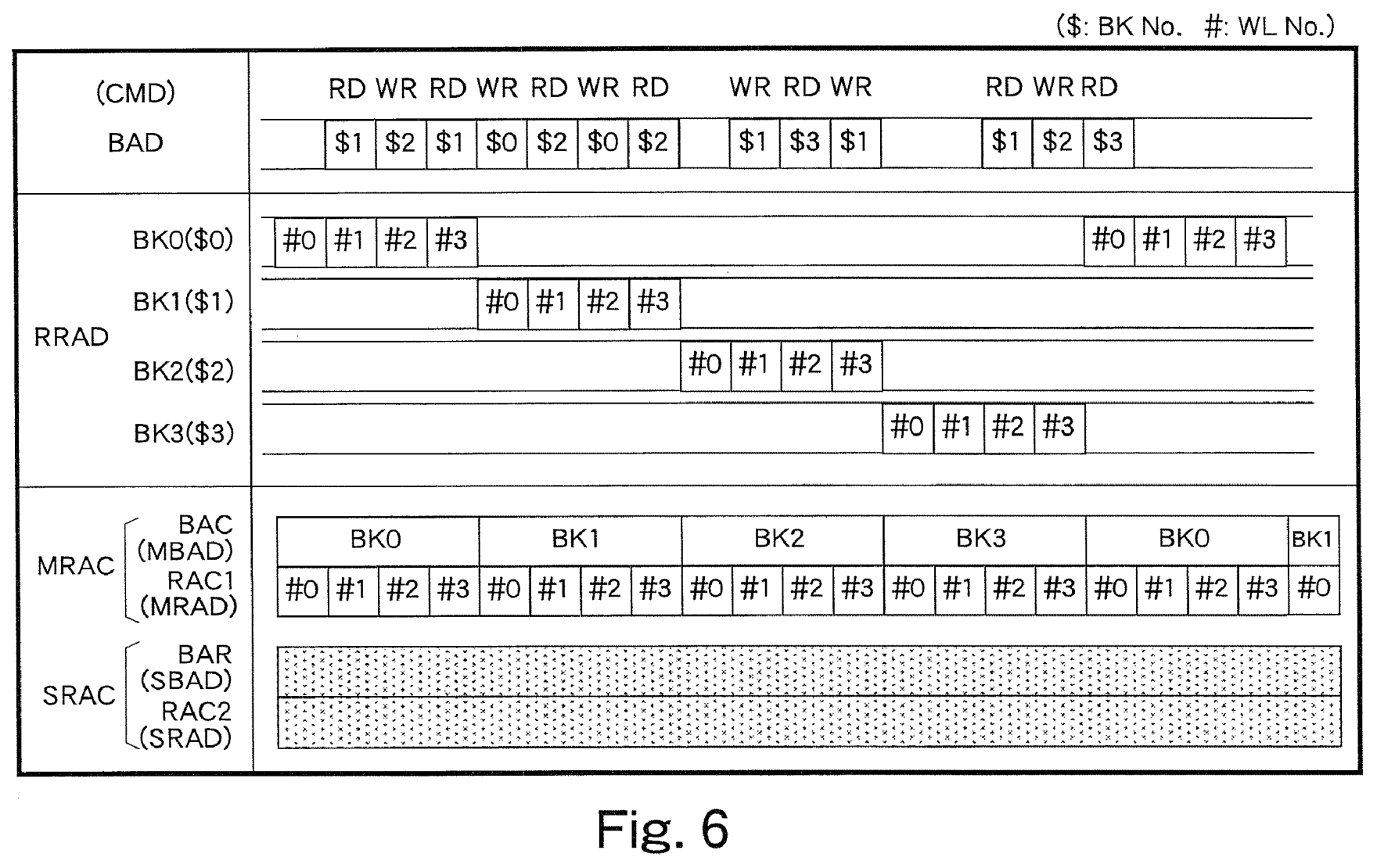

FIG. 6 illustrates an example of operations of the semiconductor memory MEM of the first embodiment. For easier understanding of the description, in FIG. 6, a generation cycle of the refresh request RREQ is equal to an output cycle of the refresh row address RRAD and is substantially equal to a supply cycle of the access command RD, WR. Each square frame with the bank address BAD represents an access operation, and each square frame with the refresh row address RRAD represents a refresh operation. In this example, the access operation and the refresh operation do not conflict with each other in the same bank BK. Therefore, the sub use signal SUSEZ illustrated in FIG. 3 is not activated and the sub refresh address counter SRAC is not used.

The hatched portions of the addresses SBAD, SRAD represent a state where the sub refresh address counter SRAC is not used. Since the refresh operation is executed by using only the main refresh address counter MRAC, the refresh addresses MBAD, MRAD (RRAD) sequentially increment in accordance with the execution of the refresh operation. Then, the memory cells MC coupled to the word lines WL0-3 (#0-3) of each of the banks BK0-3 are sequentially refreshed.

Figure 7:
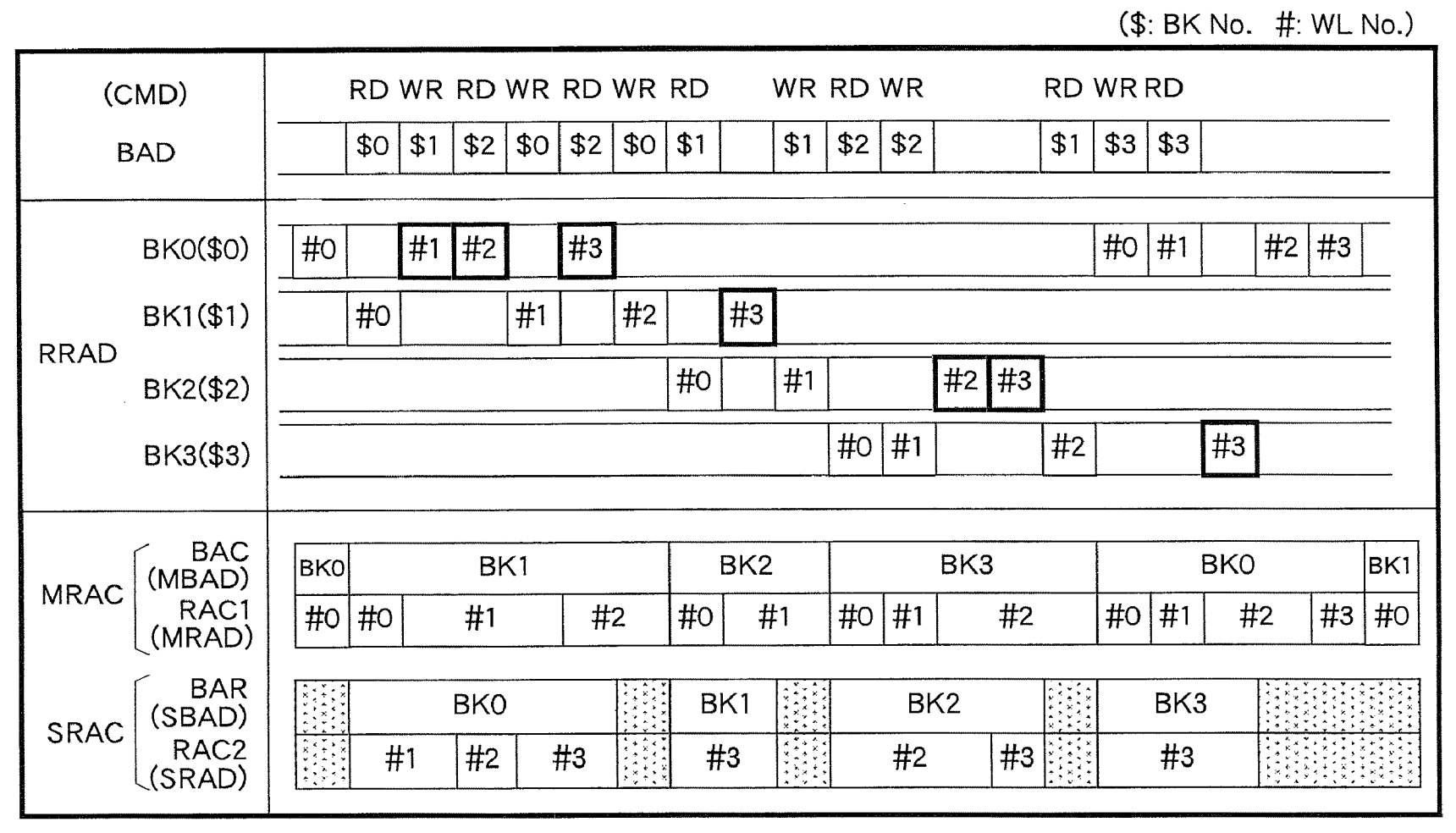

FIG. 7 illustrates another example of the operations of the memory MEM of the first embodiment. Each square frame with the bank address BAD represents an access operation, and each square frame with the refresh row address RRAD represents a refresh operation.

Each heavy-line frame represents the refresh operation executed by using the sub refresh address counter SRAC. In this example, the access operation and the refresh operation sometimes conflict with each other in the same bank BK. As in FIG. 6, a generation cycle of the refresh request RREQ is equal to an output cycle of the refresh row address RRAD and is substantially equal to a supply cycle of the access command RD, WR. The first refresh operation and operations corresponding to seven continuous access operations RD, WR, RD, WR, RD, WR, RD are the same as those in FIG. 5. The hatched portions of the addresses SBAD, SRAD represent a state where the sub refresh address counter SRAC is not used.

The sub refresh address counter SRAC is set valid when the values of the main refresh address counter MRAC are transferred to the sub refresh address counter SRAC in response to the coincidence of the block address MBAD of the main refresh address counter MRAC and the block address BAD supplied with the access command RD (or WR). When the sub refresh address counter SRAC is valid, the refresh operation is executed by using the sub refresh address counter SRAC with higher priority, except when the block address BAD and the sub block address SBAD conflict with each other.

The sub refresh address counter SRAC operates in order to execute the refresh operation corresponding to the row address RRAD for which the refresh operation cannot be executed by using the main refresh address counter MRAC. Therefore, there is no need to update the sub block address SBAD held in the sub refresh address counter SRAC. Therefore, the sub refresh address counter SRAC can be formed by the sub row address counter RAC2 and the sub block address register BAR, which enables a reduction in circuit scale.

As illustrated in FIG. 7, when the access request and the refresh request conflict with each other, the operation control circuit 16 is capable of executing the access operation without any influence from the refresh operation, and executing the refresh operation without any influence from the access operation. For example, a bank or the like for storing parity data is not necessary in order to regenerate read data of a bank in which the refresh operation is executed. As a result, it is possible to execute the refresh operation with a minimum increase in circuit scale and without any deterioration in access efficiency.

Figure 8:
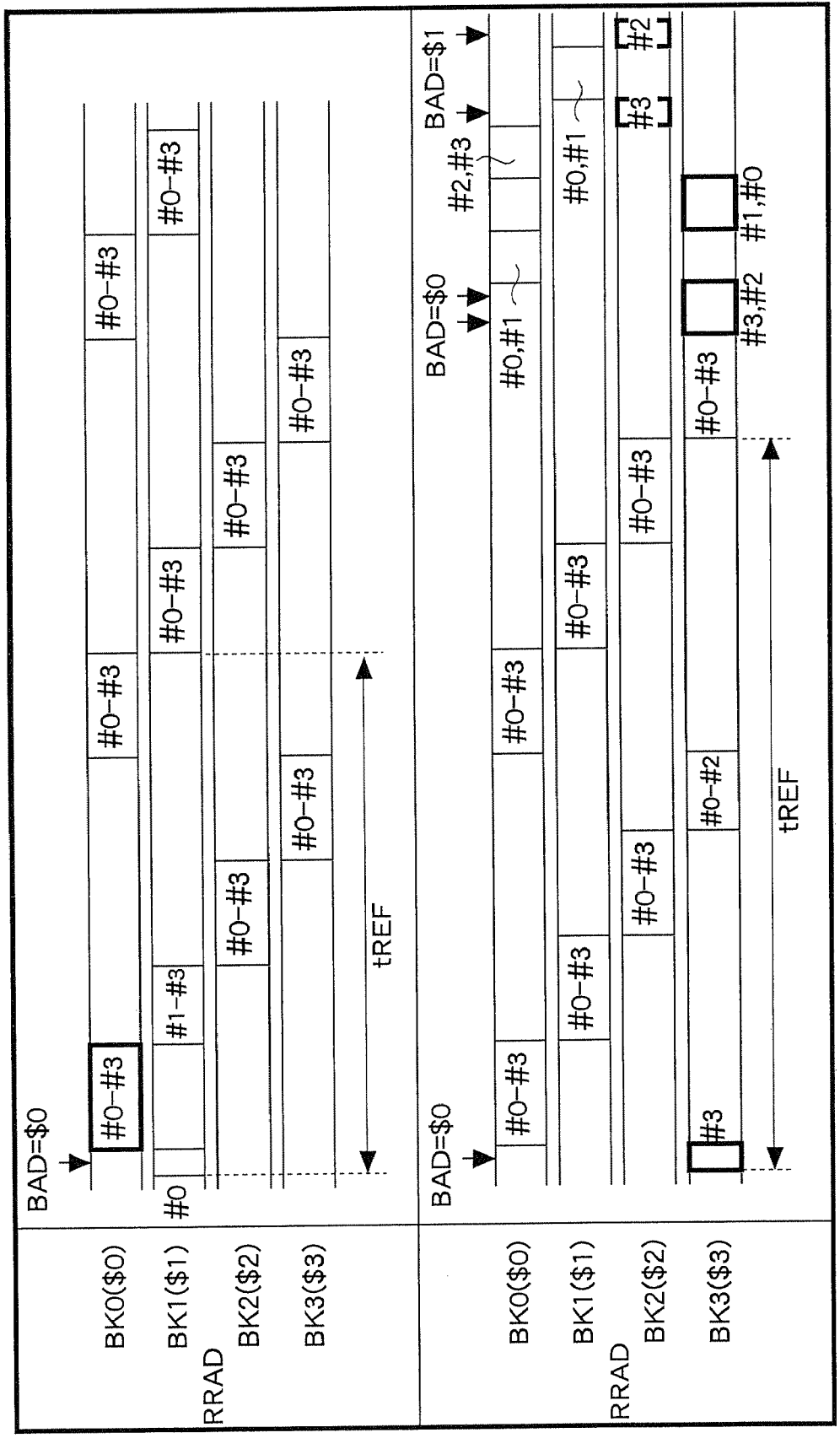
FIG. 8 illustrates a comparative example of the first embodiment.

FIG. 8 illustrates a comparative example of the first embodiment. The upper side in FIG. 8 illustrates operations of this embodiment and the lower side in FIG. 8 illustrates operations studied by the inventor in the past. The refresh row addresses RRAD (#0-3) in the heavy-line frame in FIG. 8 are those generated by using the sub refresh address counter SRAC.

In the past study (the lower side in FIG. 8), the sub refresh address counter SRAC sequentially decrements (counts down) the refresh addresses SBAD, SRAD from the maximum value to the minimum value as is contrast to the operation of the main refresh address counter MRAC. Further, the sub refresh address counter SRAC is used only when the refresh block address MBAD held in the main refresh address counter MRAC coincides with the block address BAD supplied with the access command RD (or WR). When the ascending value of the counter MRAC and the descending value of the counter SRAC coincide with each other, the counters MRAC, SRAC are reset to the minimum value and the maximum value respectively.

For example, when the block addresses BAD, MBAD coincide with each other, the refresh operation is executed by using the sub refresh address counter SRAC ($3, #3). Thereafter, when the block addresses BAD, MBAD do not coincide with each other, the refresh operation is executed by using the main refresh address counter MRAC. Since the up counter MRAC and the down counter SRAC are used to control the refresh operation, a refresh interval tREF of the word line WL3 (#3) of the bank BK3 ($3) is substantially equal to two cycles of the counter MRAC. The frequency of the refresh request RREQ needs to be set to about a half of that of this embodiment, based on this worst condition. As a result, current consumption (especially a standby current) of the memory MEM increases.

On the other hand, in this embodiment (the upper side in FIG. 8), the refresh operation is executed by using the sub refresh address counter SRAC with higher priority when the sub refresh address counter SRAC is valid. That is, when the main block address MBAD coincides with the block address BAD, the refresh operation is executed with higher priority by using the block address (SBAD) transferred from the main refresh address counter MRAC. This can prevent the execution sequence of the refresh operation from greatly varying when the sub refresh address counter SRAC is used. Therefore, an increase in an interval of the refresh operation in each of the memory cells can be suppressed. Further, since the counters MRAC, SRAC are both up counters and are the same in update sequence, the refresh interval tREF of the word line WL of interest can be substantially equal to one cycle of the counter MRAC even when the block addresses BAD, MBAD coincide with each other.

FIG. 9 illustrates operations of the banks BK of the first embodiment. In this example, the read command RD and the write command WR are supplied continuously. Each hatched portion in FIG. 9 represents the standby period in which the command signal CMD is not supplied to the memory MEM. For easier understanding of the description, FIG. 9 illustrates an example where a generation cycle of the refresh request RREQ is substantially equal cycle to a supply cycle of the access command RD, WR.

First, the read command RD is supplied immediately after the refresh request RREQ (FIG. 9 (*a, b*)). The access request and the refresh request conflict with each other. The operation control circuit 16 illustrated in FIG. 1 activates the refresh signal REFZ after the access addresses BAD, RAD are supplied to the banks BK, in order to give priority to the read operation (FIG. 9 (*c*)). The operation control circuit 16 sequentially outputs the access control signals ABRS, AWLZ, ALEZ, ACLZ for read operation in synchronization with the read command RD (FIG. 9 (*d*)). Consequently, the read operation is executed, and read data RDT are output from the memory cells MC to the bit line pairs BL, /BL of the bank BK selected according to the block address BAD and are amplified (FIG. 9 (*e*)).

The refresh addresses RBAD, RRAD are selected in synchronization with the refresh signal REFZ (FIG. 9 (*f*)). The operation control circuit 16 sequentially outputs the refresh control signals RBRS, RWLZ, RLEZ in synchronization with the activation of the refresh signal REFZ (FIG. 9 (*g*)). Consequently, the refresh operation is executed and refresh data REFDT are output from the memory cells MC to the bit line pairs BL, /BL of the bank BK selected according to the block address RBAD and are amplified (FIG. 9 (*h*)). Incidentally, as a result of the operations of the refresh control circuit 18 illustrated in FIG. 3, the block address RBAD is different from the block address BAD supplied with the read operation RD. That is, the operation control circuit 16 executes the refresh operation of the bank BK in which the access operation is not executed, when the access request and the refresh request conflict with each other. The same applies to the write operation.

Since the access control signals ABRS, AWLZ, ALEZ, ACLZ and the refresh control signals RBRS, RWLZ, RLEZ are supplied to the banks BK through the signal lines independent of each other, the refresh operation can be executed in parallel to the read operation or the write operation. Therefore, even when the refresh request RREQ and the access command RD or WR conflict with each other, no increase in a read operation cycle or a write operation cycle is required. As a result, it is possible to shorten a supply interval of the read command RD and the write command WR, which enables improved access efficiency.

Next, the write command WR is supplied immediately before the refresh request RREQ (FIG. 9 ($i, j$)). The operation control circuit 16 activates the refresh signal REFZ after the access addresses BAD, RAD are supplied to the bank BK, in order to give priority to the write operation (FIG. 9 ($k$)). Further, the operation control circuit 16 sequentially outputs the access control signals ABRS, AWLZ, ALEZ, ACLZ for write operation in synchronization with the write command WR (FIG. 9 ($l$)). Consequently, the write operation is executed. Concretely, data are output from the memory cells MC to the bit line pairs BL, /BL of the bank BK selected according to the block address BAD, and after the data are amplified, write data WDT are supplied to the bit line pairs BL, /BL to be written to the memory cells MC (FIG. 9 ($m$)). Thereafter, similarly to the above-described read cycle, the refresh operation is executed in synchronization with the refresh signal REFZ (FIG. 9 ($n$)). Owing to the operation of the refresh control circuit 18, the write operation and the refresh operation are executed simultaneously in different banks BK.

Next, the refresh request RREQ is generated during the standby period (FIG. 9 ($o$)). The refresh request RREQ conflicts neither of the access commands RD, WR (access requests). Therefore, the operation control circuit 16 activates the refresh signal REFZ in synchronization with the refresh request RREQ (FIG. 9 ($p$)) to execute the refresh operation (FIG. 9 ($q$)).

Generally, the write operation takes a longer time than the read operation and the refresh operation since the write operation inverses data on the bit line pairs BL, /BL. However, in this embodiment, for improved usability for a user using the memory MEM, the specification of the read operation cycle is set so as to match the specification of the write operation cycle. Therefore, the generation timings of the access control signals ABRS, AWLZ, ALEZ, ACLZ are set to the same timings both for the read operation and the write operation.

A generation period of the refresh control signals RBRS, RWLZ, RLEZ for the refresh operation is set shorter than a generation period of the access control signals ABRS, AWLZ, ALEZ, ACLZ. That is, the refresh operation time is shorter than the read operation time and the write operation time. Consequently, even when the refresh operation is started later than the read operation or the write operation because the supply of the refresh addresses RBAD, RRAD is delayed due to the confliction of the refresh request RREQ and the access command RD or WR (access request), it is possible to complete the refresh operation within the read operation cycle or the write operation cycle.

In the first embodiment described above, when the access request and the refresh request conflict with each other, the refresh operation is executed in a bank BK in which the access operation is not executed, and consequently, the simultaneous execution of the access operation and the refresh operation without any mutual interference is possible. As a result, it is possible to execute the refresh operation with a minimum increase in circuit scale and without any deterioration in access efficiency.

When the main block address MBAD coincides with the access block address BAD, the refresh operation is executed with higher priority by using the block address (SBAD) transferred from the main refresh address counter MRAC. This can prevent the execution sequence of the refresh operation from greatly varying when the sub refresh address counter SRAC is used. Therefore, an increase in the interval of the refresh operation in each of the memory cells can be suppressed. As a result, deterioration in data retention characteristic of the memory cells can be prevented, enabling improved reliability of the semiconductor memory.

Figure 10:
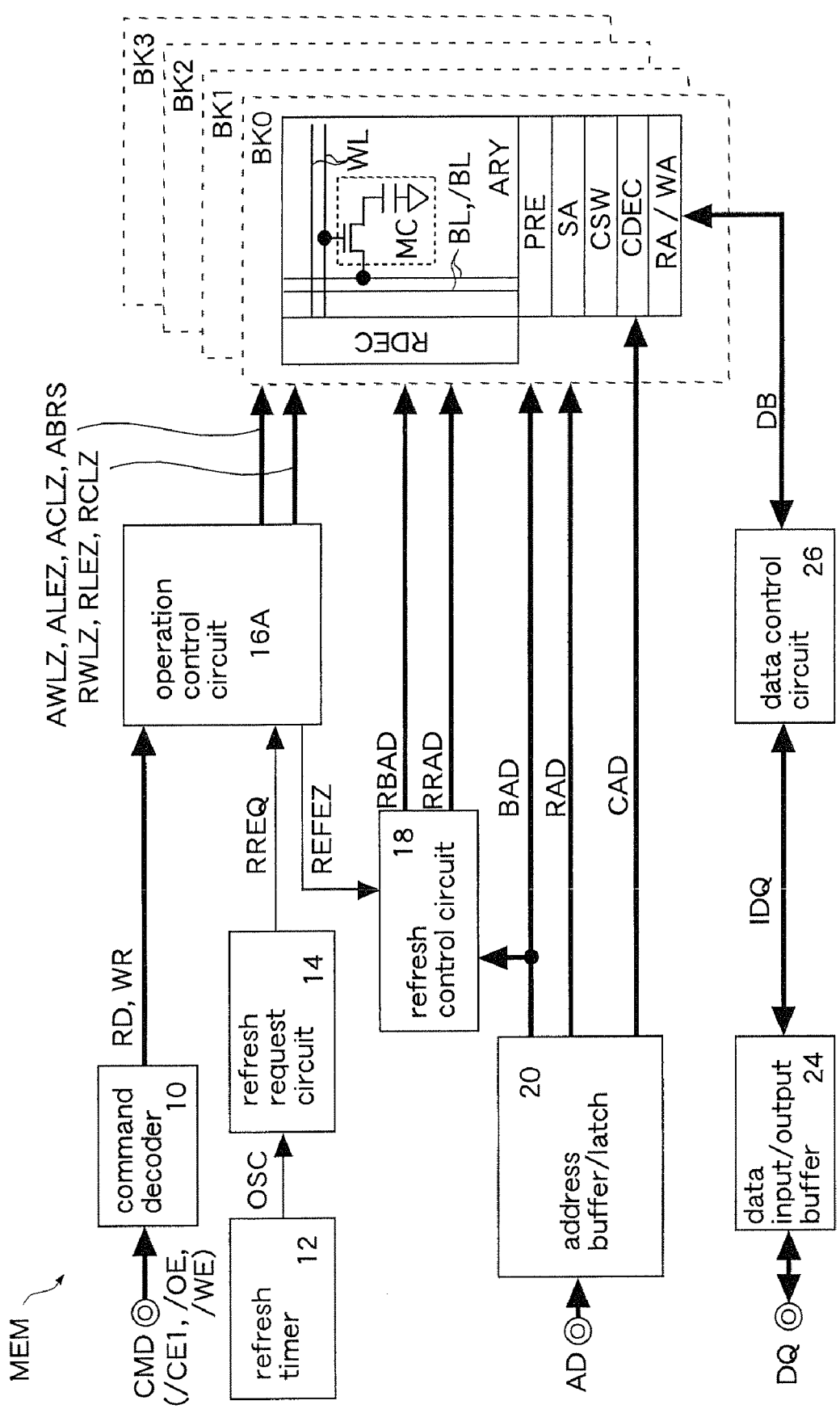
FIG. 10 illustrates a semiconductor memory of a second embodiment.

FIG. 10 illustrates a semiconductor memory of a second embodiment. The same reference numerals and symbols are used to designate the same elements as the elements described in the first embodiment, and detailed description thereof will be omitted. In this embodiment, an operation control circuit 16A is formed in place of the operation control circuit 16 of the first embodiment. Further, the semiconductor memory does not have the address selector 22 of the first embodiment and the structure of banks BK0-3 is different from that of the first embodiment. The other configuration is the same as that of the first embodiment. For example, a system SYS of this embodiment has the same configuration as that in FIG. 2.

In this embodiment, a refresh block address RBAD and a refresh row address RRAD output from a refresh control circuit 18 are supplied directly to the banks BK0-3. Each of the banks BK0-3 has an OR circuit (not illustrated) receiving a block address BAD and the refresh block address RBAD and an OR circuit (not illustrated) receiving a row address RAD and the refresh row address RRAD. Each of the banks BK0-3 executes an access operation when receiving the access addresses BAD, RAD, and executes a refresh operation when receiving the refresh addresses RBAD, RRAD. The other structure of the banks BK0-3 is the same as that of the first embodiment.

Since the address selector 22 does not exist, the operation control circuit 16A does not have the access priority circuit APR outputting the refresh signal REFZ for switching between the refresh addresses RBAD, RRAD and the access addresses BAD, RAD. Without performing arbitration, the operation control circuit 16A outputs access control signals AWLZ, ALEZ, ACLZ, ABRS in synchronization with an access request RD, WR, and outputs refresh control signals RWLZ, RLEZ, RBRS in synchronization with a refresh request RREQ.

Figure 11:
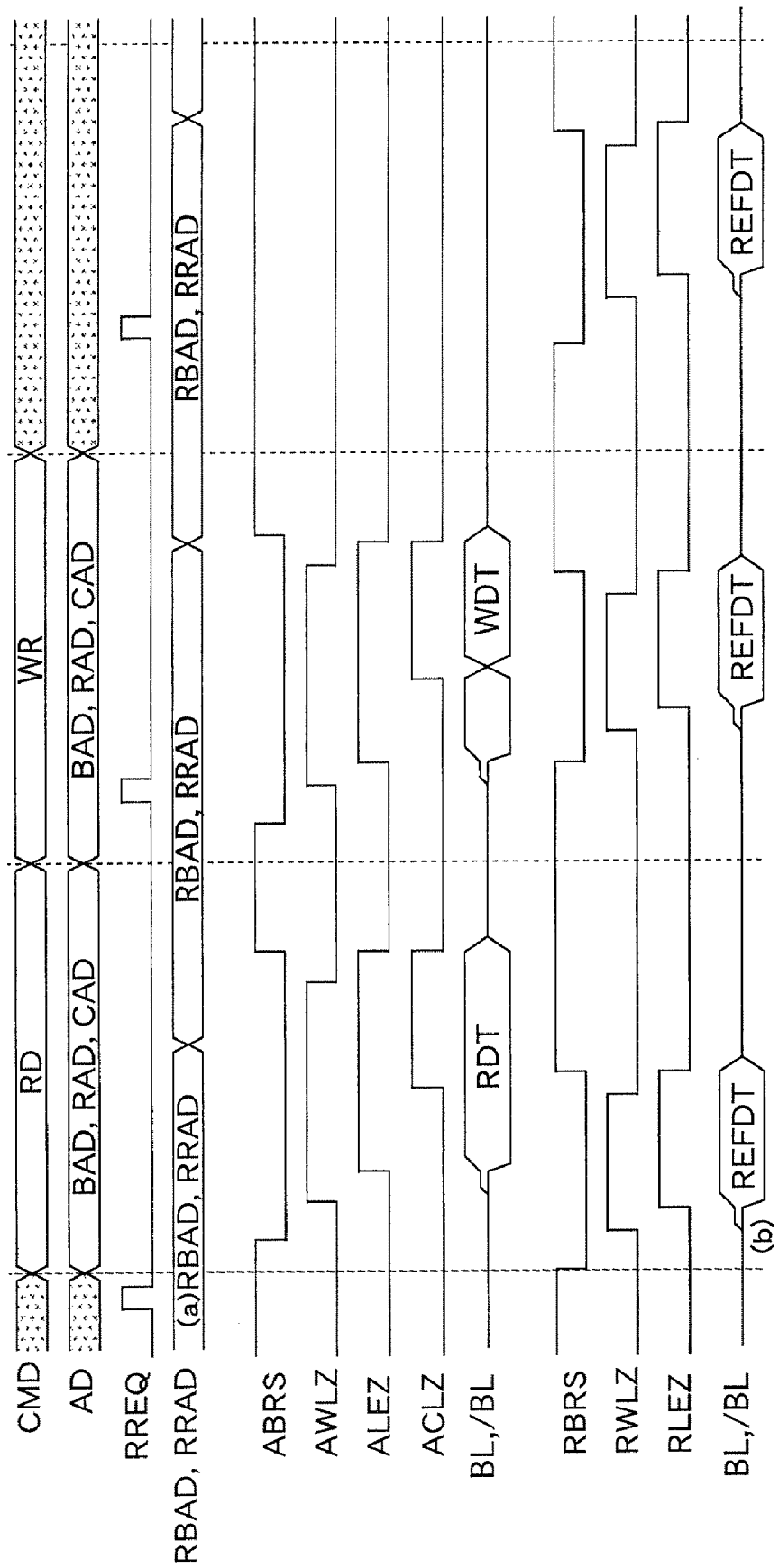
FIG. 11 illustrates operations of banks of the second embodiment.

FIG. 11 illustrates operations of the banks BK of the second embodiment. Detailed description of the same operations as those of the first embodiment (FIG. 9) will be omitted. The operations in FIG. 11 are the same as those of the first embodiment except for the execution timing of the refresh operation conflicting with the read command RD. In this embodiment, a signal line through which the access addresses BAD, RAD are supplied to the banks BK0-3 is different from a signal line through which the refresh addresses RBAD, RRAD are supplied to the banks BK0-3. Therefore, even when the access command RD, WR and the refresh request RREQ conflict with each other, the refresh addresses RBAD, RRAD can be supplied to the banks BK0-3 immediately after the refresh request RREQ, in synchronization with the refresh request RREQ (FIG. 11 ($a$)). That is, the refresh operation can be executed in synchronization with the refresh request RREQ (FIG. 11 ($b$)).

The second embodiment described above can provide the same effects as those of the above-described first embodiment. In addition, in this embodiment, the access address signal lines through which the access addresses BAD, RAD are supplied to the banks BK0-3 are laid independently of the refresh address signal lines through which the refresh addresses RBAD, RRAD are supplied to the banks BK0-3. This makes it possible to always start the refresh operation in synchronization with the refresh request RREQ even when the access operation and the refresh operation are simultaneously executed due to the confliction of the access command RD, WR with the refresh request RREQ. That is, it is possible to execute the refresh operation without any deterioration in access efficiency.

Figure 12:
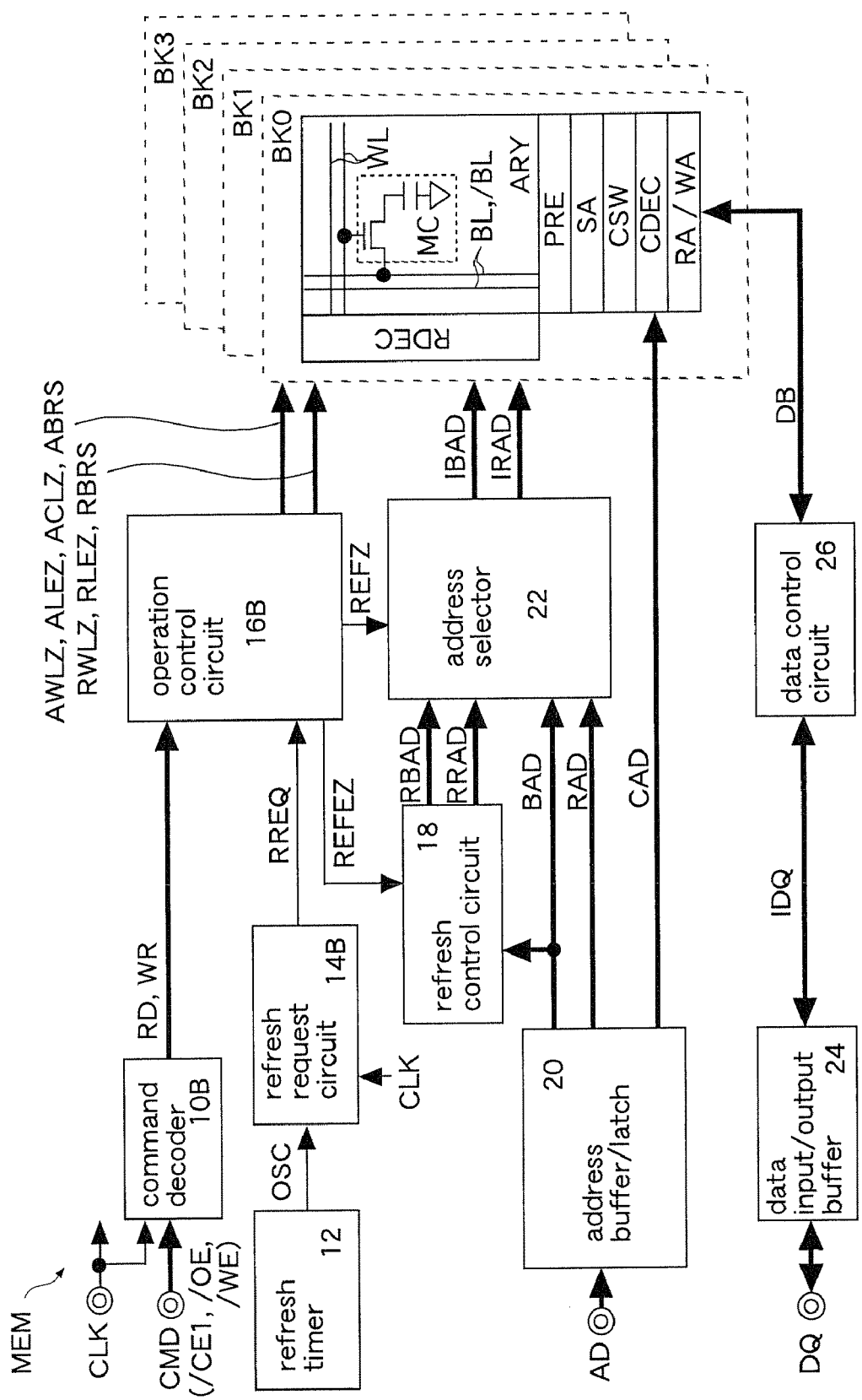
FIG. 12 illustrates a semiconductor memory of a third embodiment.

FIG. 12 illustrates a semiconductor memory of a third embodiment. The same reference numerals and symbols are used to designate the same elements as the elements described in the first embodiment, and detailed description thereof will be omitted. In this embodiment, a command decoder 10B, a refresh request circuit 14B, and an operation control circuit 16B are formed in place of the command decoder 10, the refresh request circuit 14, and the operation control circuit 16 of the first embodiment. The semiconductor memory operates in synchronization with a clock signal CLK. The clock signal CLK is supplied to main circuit blocks and these circuits operate in synchronization with the clock signal CLK. The other configuration is the same as that of the first embodiment. For example, a system SYS of this embodiment has the same configuration as that in FIG. 2 except in that the memory MEM receives the clock signal CLK.

The command decoder 10B decodes a command signal CMD in synchronization with a rising edge of the clock signal CLK to output the resultant as an external access request RD, WR. The refresh request circuit 14B divides a frequency of an oscillating signal OSC to output a refresh request signal RREQ in synchronization with, for example, a falling edge of the clock signal CLK. Consequently, when the external access request RD, WR conflicts with the internal refresh request RREQ, the external access request RD, WR is always supplied to the operation control circuit 16B earlier than the refresh request RREQ. Therefore, the operation control circuit 16B need not have an arbiter such as the access priority circuit deciding the priority sequence of the external access request RD, WR and the refresh request RREQ.

The operation control circuit 16B outputs access control signals AWLZ, ALEZ, ACLZ, ABRS in response to the external access request RD, WR in order to execute a read operation or a write operation, and outputs refresh control signals RWLZ, RLEZ, RBRS in response to the refresh request RREQ in order to execute a refresh operation.

Figure 13:
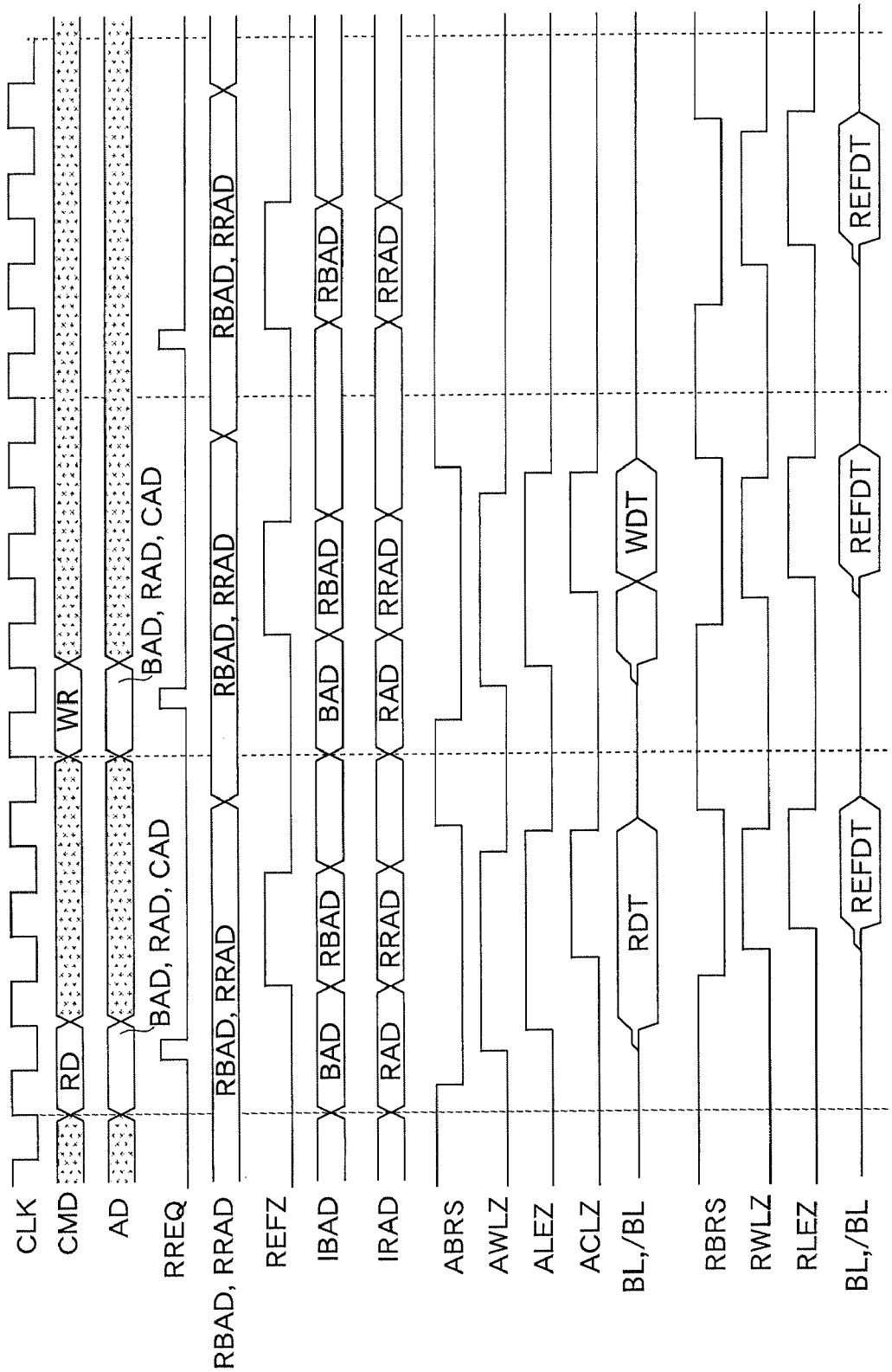
FIG. 13 illustrates operations of banks of the third embodiment.

FIG. 13 illustrates operations of banks BK of the third embodiment. Detailed description of the same operations as those of the first embodiment (FIG. 9) will be omitted. The operations in FIG. 13 are the same as those of the first embodiment except in that the memory MEM receives the command signal CMD and an address signal AD in synchronization with the clock signal CLK and the refresh request RREQ is generated in synchronization with the falling edges of the clock signal CLK. However, the refresh request RREQ generated in an access cycle is always generated later than the external access request RD, WR. Therefore, the refresh operation is started after the read operation/write operation is started.

The third embodiment described above can provide the same effects as those of the above-described first embodiment. In addition, in this embodiment, the refresh request RREQ generated in the access cycle is always generated later than the external access request RD, WR, which can prevent the refresh request RREQ from conflicting with the external access request RD, WR. As a result, the operation control circuit 16B can be formed with a simple structure.

Figure 14:
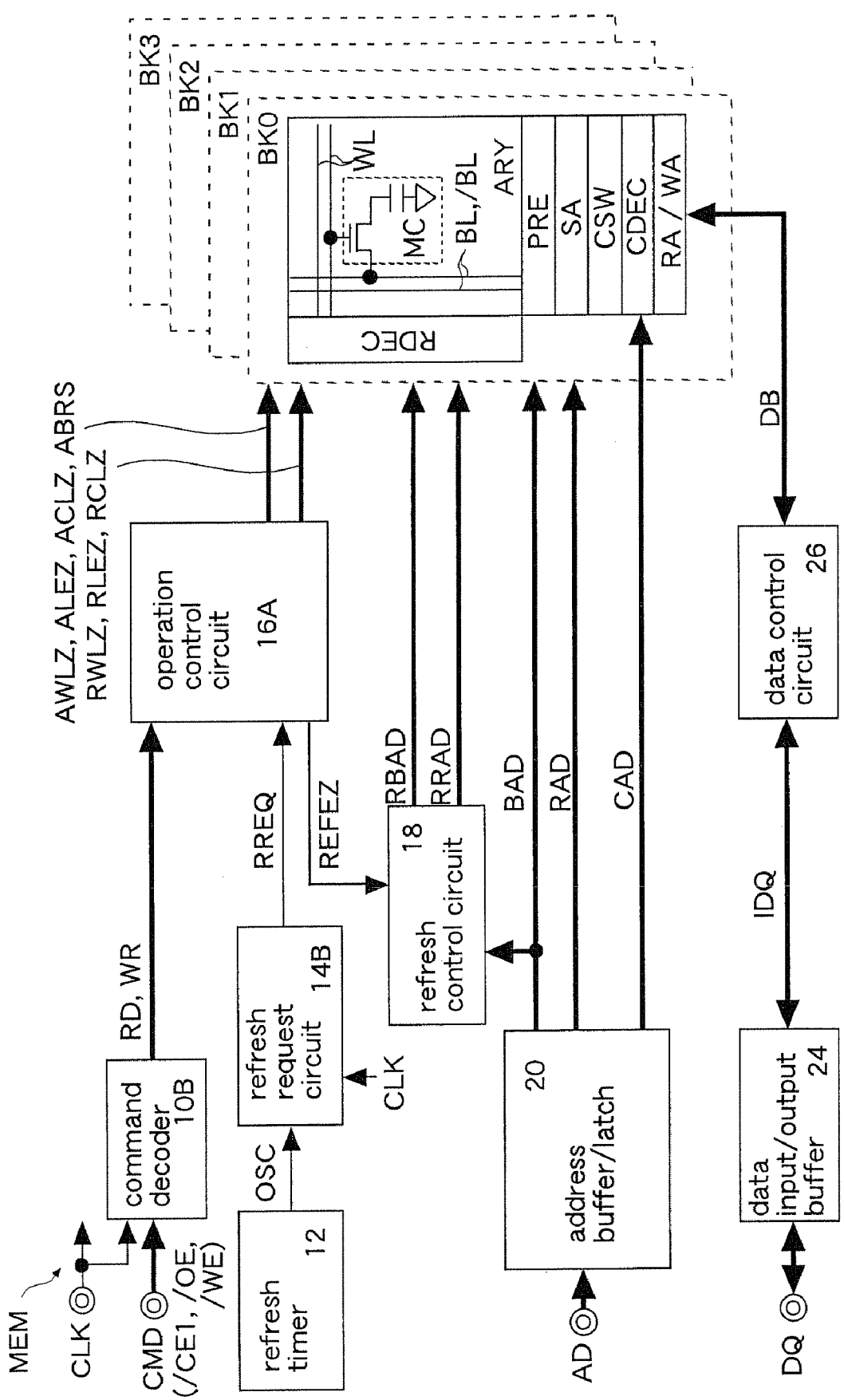
FIG. 14 illustrates a semiconductor memory of a fourth embodiment.

FIG. 14 illustrates a semiconductor memory of a fourth embodiment. The same reference numerals and symbols are used to designate the same elements as the elements described in the first and second embodiments, and detailed description thereof will be omitted. In this embodiment, a command decoder 10B and a refresh request circuit 14B are formed in place of the command decoder 10 and the refresh request circuit 14 of the second embodiment. The command decoder 10B and the refresh request circuit 14B are the same as those of the third embodiment. The semiconductor memory operates in synchronization with a clock signal CLK. The clock signal CLK is supplied to main circuit blocks and these circuits operate in synchronization with the clock signal CLK. The other configuration is the same as that of the second embodiment. For example, a system SYS of this embodiment has the same configuration as that in FIG. 2 except in that the memory MEM receives the clock signal CLK.

Figure 15:
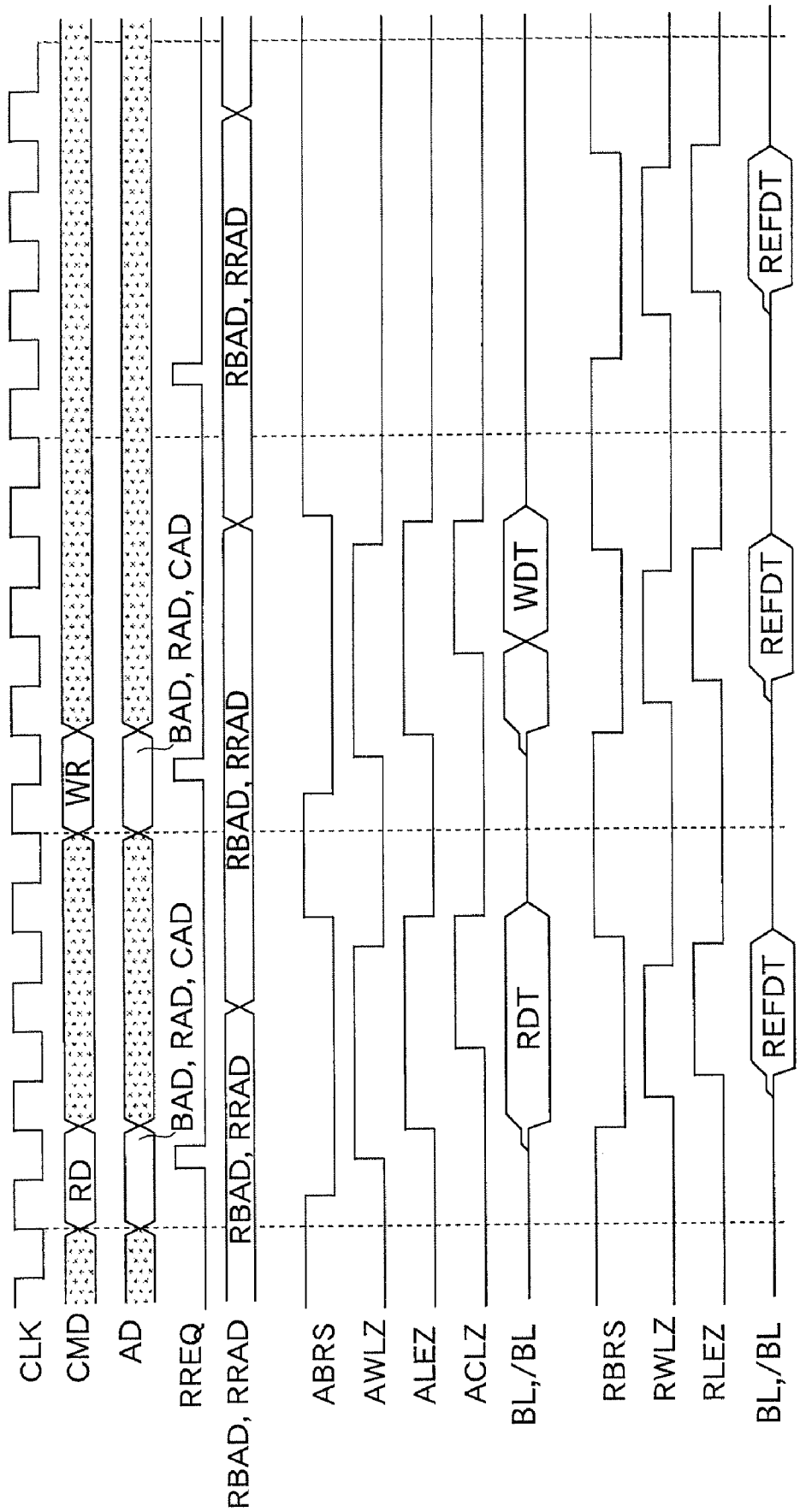
FIG. 15 illustrates operations of banks of the fourth embodiment.

FIG. 15 illustrates operations of banks BK of the fourth embodiment. Detailed description of the same operations as those of the second embodiment (FIG. 11) will be omitted. The operations in FIG. 15 are the same as those of the second embodiment except in that the memory MEM receives a command signal CMD and an address signal AD in synchronization with the clock signal CLK and a refresh request RREQ is generated in synchronization with failing edges of the clock signal CLK. However, the refresh request RREQ generated in an access cycle is always generated later than external access request RD, WR. Therefore, a refresh operation is started after a read operation/write operation is started. The fourth embodiment described above can provide the same effects as those of the above-described first, second, and third embodiments.

Figure 16:
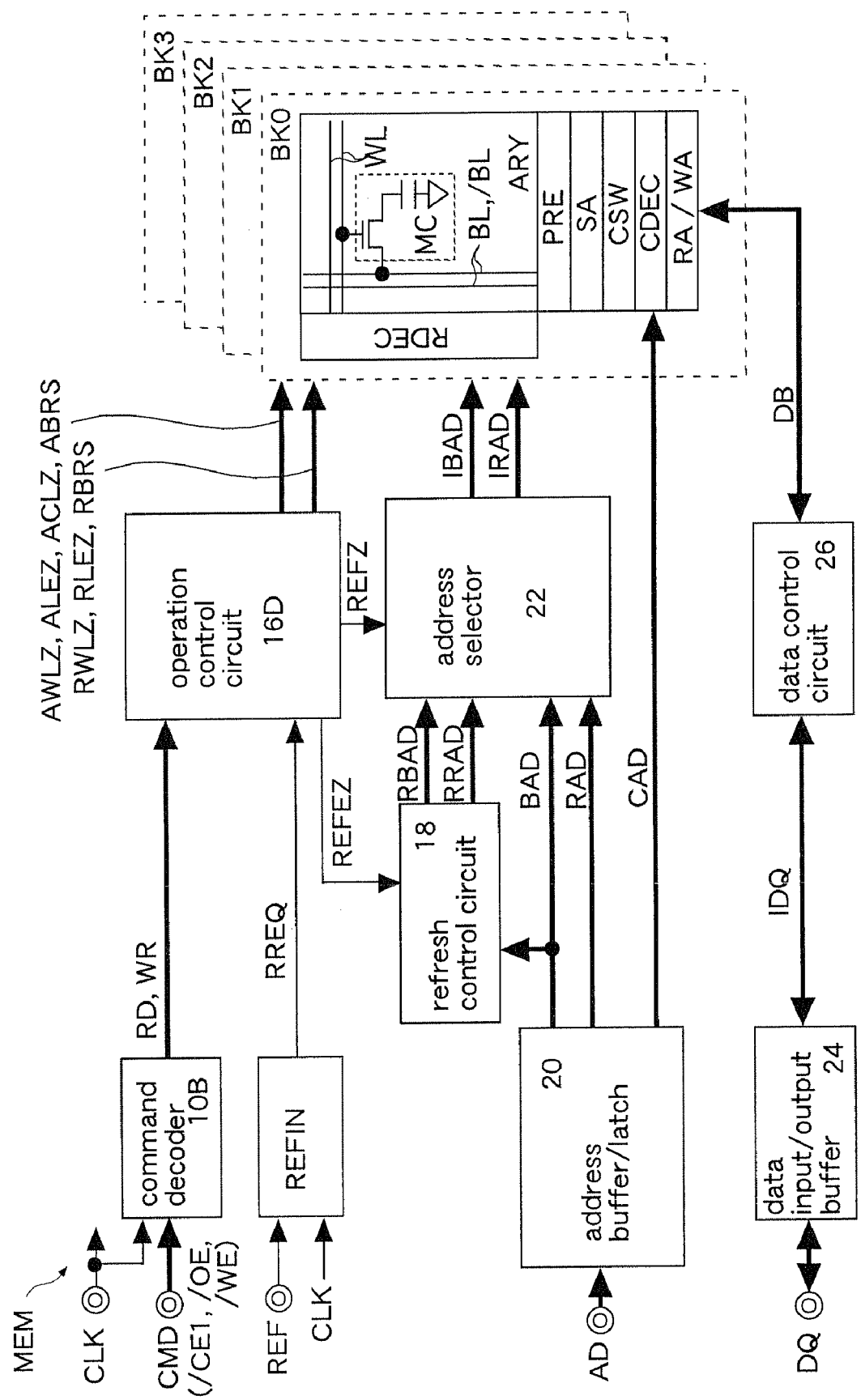
FIG. 16 illustrates a semiconductor memory of a fifth embodiment.

FIG. 16 illustrates a semiconductor memory of a fifth embodiment. The same reference numerals and symbols are used to designate the same elements as the elements described in the first and third embodiments, and detailed description thereof will be omitted. In this embodiment, a command decoder 10B and an operation control circuit 16D are formed in place of the command decoder 10 and the operation control circuit 16 of the first embodiment. The command decoder 10B is the same as that of the third embodiment. The refresh timer 12 and the refresh request circuit 14 of the first embodiment are not provided, and a refresh terminal REF receiving a refresh request signal RREQ and an input buffer REFIN receiving the refresh request signal RREQ supplied via the refresh terminal REF are newly formed. The semiconductor memory operates in synchronization with a clock signal CLK. The clock signal CLK is supplied to main circuit blocks and these circuits operate in synchronization with the clock signal CLK. The other configuration is the same as that of the first embodiment. For example, a system SYS of this embodiment has the same configuration as that in FIG. 2 except in that the memory MEM receives the clock signal CLK and a CPU (controller) outputs the refresh request signal RREQ.

The input buffer REFIN receives the refresh request signal RREQ in synchronization with rising edges of the clock signal CLK. The refresh request RREQ is always supplied to the operation control circuit 16D at a timing a half-clock later than an external access request RD, WR. In order to first execute a read operation or a write operation when sequentially receiving the external access request RD, WR and the refresh request RREQ, the operation control circuit 16D outputs access control signals AWLZ, ALEZ, ACLZ, ABRS, and thereafter outputs refresh control signals RWLZ, RLEZ, RBRS in order to execute a refresh operation. The operation control circuit 16D outputs the access control signals AWLZ, ALEZ, ACLZ, ABRS when receiving the external access request RD, WR, in order to execute the read operation or the write operation. In this embodiment, the refresh request RREQ is always supplied with the external access request RD, WR according to the product specifications of the memory MEM.

Figure 17:
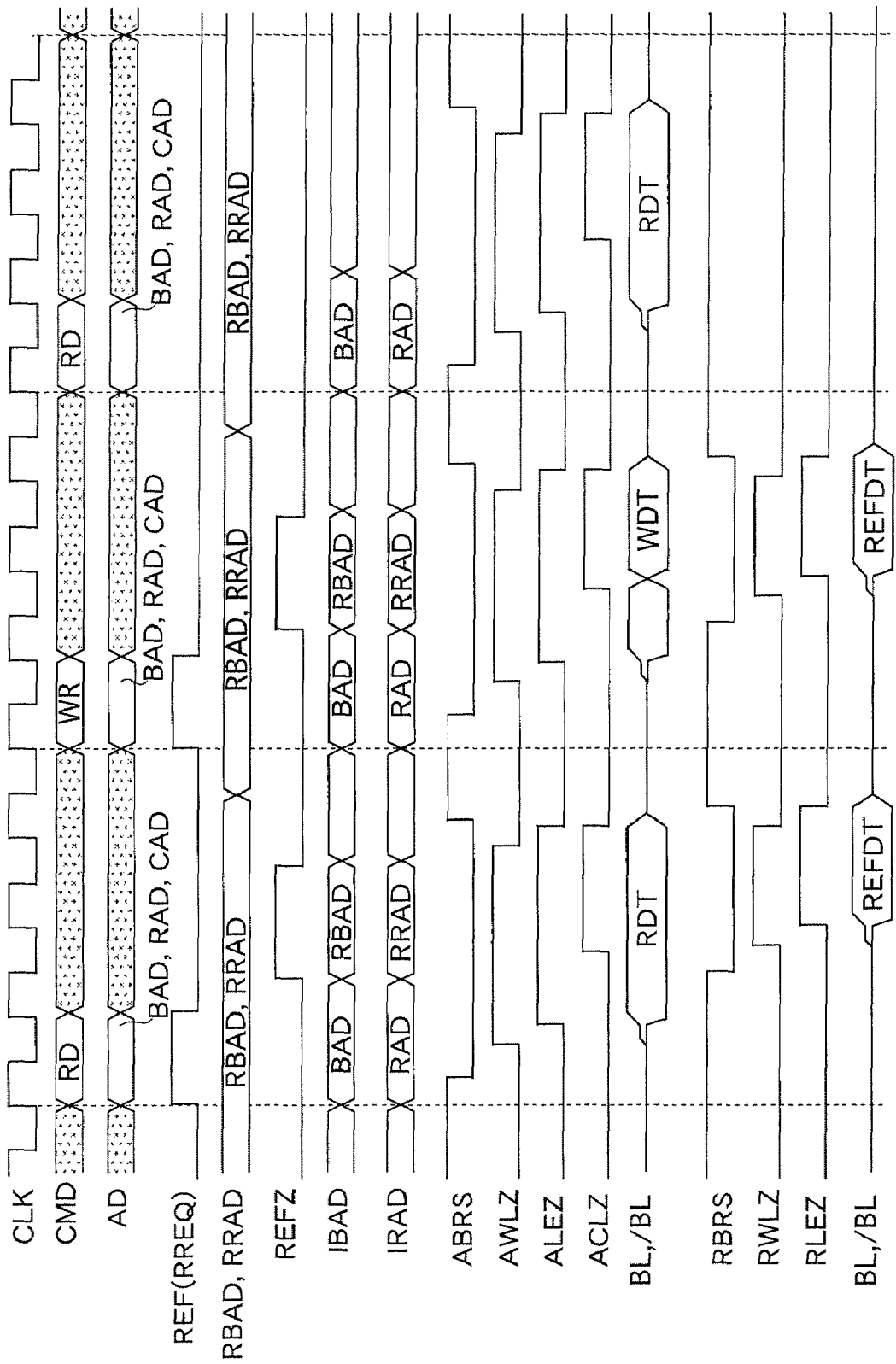
FIG. 17 illustrates operations of banks of the fifth embodiment.

FIG. 17 illustrates operations of banks BK of the fifth embodiment. Detailed description of the same operations as those of the first and third embodiments (FIG. 9, FIG. 13) will be omitted. The operations in FIG. 17 are the same as those of the third embodiment except in that the refresh request RREQ is supplied from an external part of the memory MEM via the refresh terminal REF. However, the refresh request RREQ is never supplied during a standby period in which neither of the external access requests RD, WR is supplied. The fifth embodiment described above can provide the same effects as those of the above-described first, second, and third embodiments.

Figure 18:
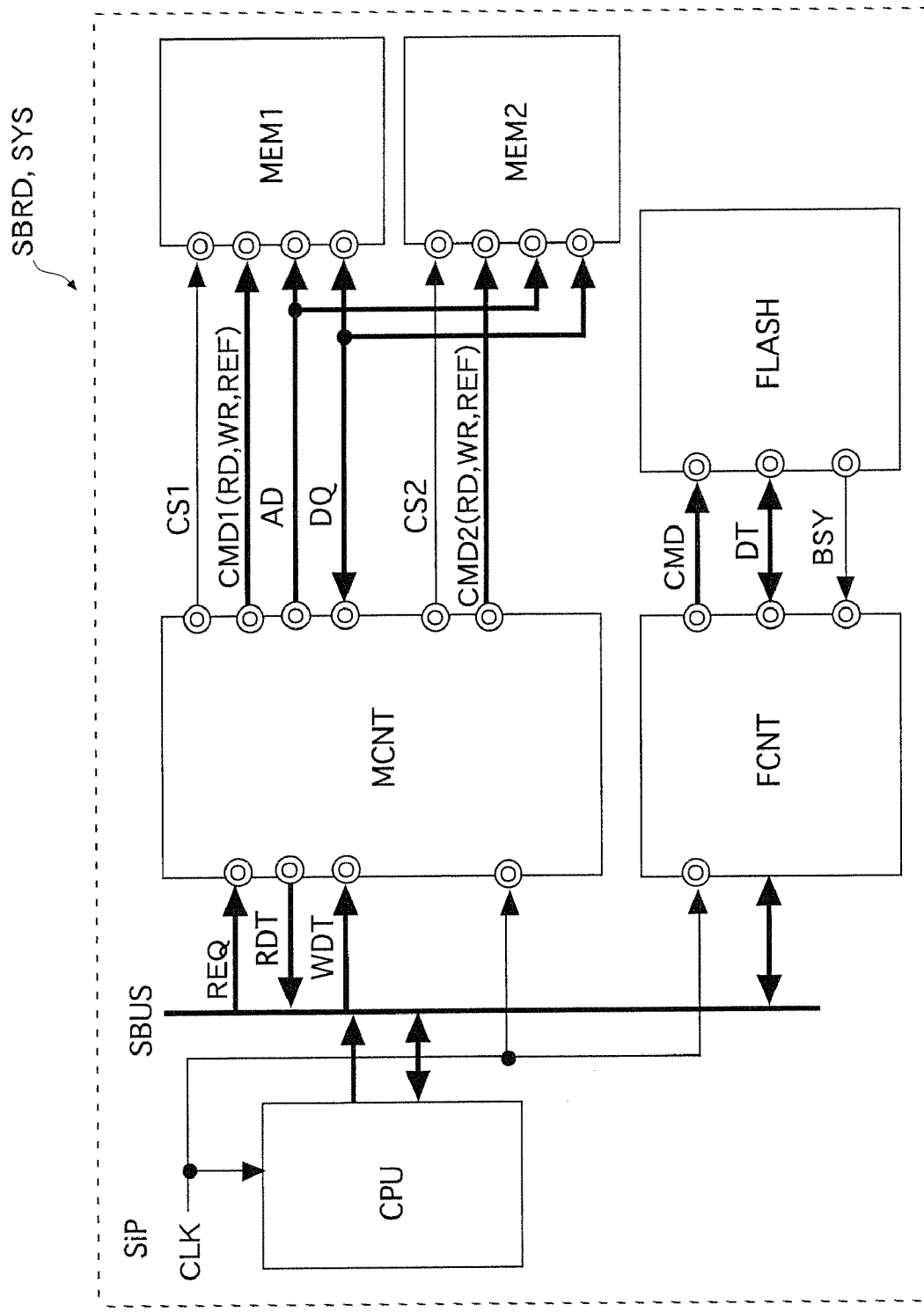
FIG. 18 illustrates a system of a sixth embodiment.

FIG. 18 illustrates a system of a sixth embodiment. The same reference numerals and symbols are used to designate the same elements as the elements described in the first embodiment, and detailed description thereof will be omitted.

As in the first embodiment, the system SYS is, for example, a portable equipment such as a mobile phone and has a system board SBRD on which a SiP (System in Package) for controlling the operation of the portable equipment is mounted. The SiP has memories MEM1, MEM2, a memory controller MCNT accessing the memories MEM1, MEM2, a flash memory FLASH, a flash controller FCNT accessing the flash memory FLASH, a CPU (system controller) controlling the whole system, and so on. The CPU and the controllers MCNT, FCNT are mutually coupled via a system bus SBUS. The SiP may be coupled to an upper-order system via an external bus.

That is, the system SYS of this embodiment has the memories MEM1-2 in place of the memory MEM of the system SYS of the first embodiment and newly has the memory controller MCNT. Each of the memories MEM1-2 is, for example, a SDRAM type FCRAM (Fast Cycle RAM), and receives a refresh request REF as well as access commands RD, WR. To simplify the description, description of a clock signal is omitted. The memories MEM1, MEM2 are mapped in different address spaces. An address signal line AD and a data signal line DQ are laid commonly to the memories MEM1-2.

In this system SYS, a program and data stored in the flash memory FLASH are transferred to at least one of the memories MEM1-2 upon power-on. Thereafter, the CPU executes the program transferred to the memory MEM1-2 in order to operate the system SYS, and reads data held in the memory MEM1-2 or writes data to be held in the memory MEM1-2.

The memory controller MCNT receives an access request REQ and write data WDT via the system bus SBUS, and outputs read data RDT to the system bus SBUS. The access request REQ includes, for example, an access start address, the number of transferred words of the data, and read/write type classification. According to the access request REQ, the memory controller MCNT outputs a chip select signal CS1 and a command signal CMD1 or a chip select signal CS2 and a command signal CMD2, and an address AD to one of the memories MEM1-2 in order to access one of the memories MEM1-2. The memory controller MCNT receives read data from one of the memories MEM1-2 at the time of read access, and outputs write data to one of the memories MEM1-2 at the time of write access.

Each of the command signals CMD1-2 is a read command RD, a write command WR, or a refresh command REF. These commands RD, WR, REF are recognized based on the combination of logics of a row address strobe signal /RAS, a column address strobe signal /CAS, a write enable signal /WE.

Figure 19:
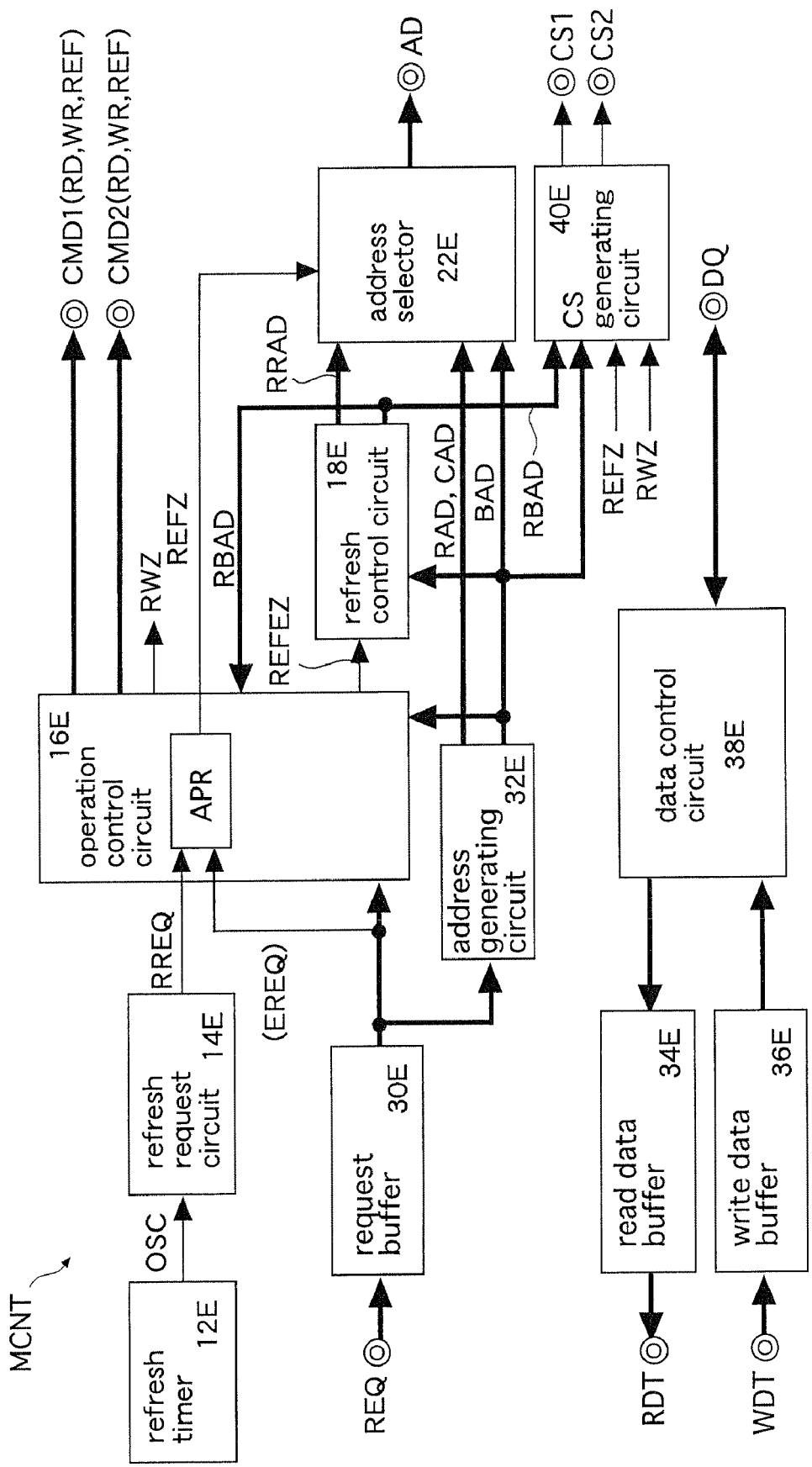
FIG. 19 illustrates details of a memory controller illustrated in FIG. 18.

FIG. 19 illustrates details of the memory controller MCNT illustrated in FIG. 18. The memory controller MCNT has a refresh timer 12E, a refresh request circuit 14E, an operation control circuit 16E, a refresh control circuit 18E, an address selector 22E, a request buffer 30E, an address generating circuit 32E, a read data buffer 34E, a write data buffer 36E, a data control circuit 38E, and a CS generating circuit 40E. The refresh timer 12E, the refresh request circuit 14E, and the refresh control circuit 18E have the same functions as those of the refresh timer 12, the refresh request circuit 14, and the refresh control circuit 18 of the first embodiment. That is, the refresh timer 12E and the refresh request circuit 14E operate as a refresh request generation circuit periodically outputting a refresh request RREQ.

The operation control circuit 16E has the same functions as those of the operation control circuit 16 of the first embodiment except in that it outputs the command signals CMD1-2 in place of the access control signals AWLZ, ALEZ, ACLZ, ABRS and the refresh control signals RWLZ, RLEZ, RBRS and newly outputs a read/write signal RWZ. The command signals CMD1-2 (RD, WR, REF) are output according to an access block address BAD and a refresh block address RBAD. The read/write signal RWZ is activated to high when a read operation or a write operation is executed. The operation control circuit 16E outputs an access control signal (one of CMD1-2) in response to an access request EREQ in order to execute an access operation of one of the memories MEM, and outputs a refresh control signal (one of CMD1-2) in response to a refresh request RREQ in order to execute a refresh operation of one of the memories MEM1-2.

The address selector 22E outputs access addresses RAD, CAD as the address AD to one of the memories MEM1-2 while a refresh signal REFZ is inactive, and outputs a refresh address RRAD as the address AD to one of the memories 1-2 while the refresh signal REFZ is active. The block addresses BAD, RBAD are used to select one of the memories MEM1-2 and therefore are supplied not to the address selector 22E but to the CS generating circuit 40E for generating chip select signals CS1-2.

The request buffer 30E sequentially holds the access requests REQ supplied from the system bus SBUS. Further, the request buffer 30E sequentially converts the held access requests REQ into access request signals EREQ conforming to a command system of the memories MEM1-2 (SDRAM) to output the access request signals EREQ.

The address generating circuit 32E generates the addresses BAD, RAD, CAD based on the access start address and so on held in the request buffer 30E. For easier understanding of the correspondence with the first embodiment, an address indicating one of the memories MEM1-2 is written as the block address BAD. As illustrated in FIG. 18, since the memory controller MCNT accesses the two memories MEM1-2, the block address BAD has one bit. Logic 0 of the block address BAD indicates that the memory MEM1 is accessed and logic 1 of the block address BAD indicates that the memory MEM2 is accessed. If the system SYS has four memories MEM1-4, the block address BAD has two bits.

The read data buffer 34E converts read data DQ read in sequence from the MEM1-2 via the data control circuit 38E, according to the specifications of the system bus SBUS (the timing specification, bit width of data, the number of data transferred, and so on), and outputs the changed data as the read data RDT to the system bus SBUS. The write data buffer 36E sequentially holds the write data WDT supplied from the system bus SBUS. Further, the write data buffer 36E converts the format of the held write data WDT according to the specifications of the memories MEM1-2 (bit width of data and so on) and outputs the converted data to the data control circuit 38E. The data control circuit 38E outputs read data received at a data terminal DQ to the read data buffer 34E, and outputs, to the data terminal DQ, write data received from the write data buffer 36E.

The CS generating circuit 40E receives the block addresses BAD, RBAD, the refresh signal REFZ, and the read/write signal RWZ, and determines in which one of the memories MEM1-2 an access operation or a refresh operation is to be executed, and outputs one of the chip select signals CS1-2 according to the determination result.

The refresh control circuit 18E is the same as the refresh control circuit 18 (FIG. 3) of the first embodiment. Here, the block addresses MBAD, SBAD, RBAD in FIG. 3 are addresses indicating one of the memories MEM1-2. The block address counter BAC and the block address register BAR hold address information indicating one of the memories MEM1-2 to be refreshed.

Figure 20:
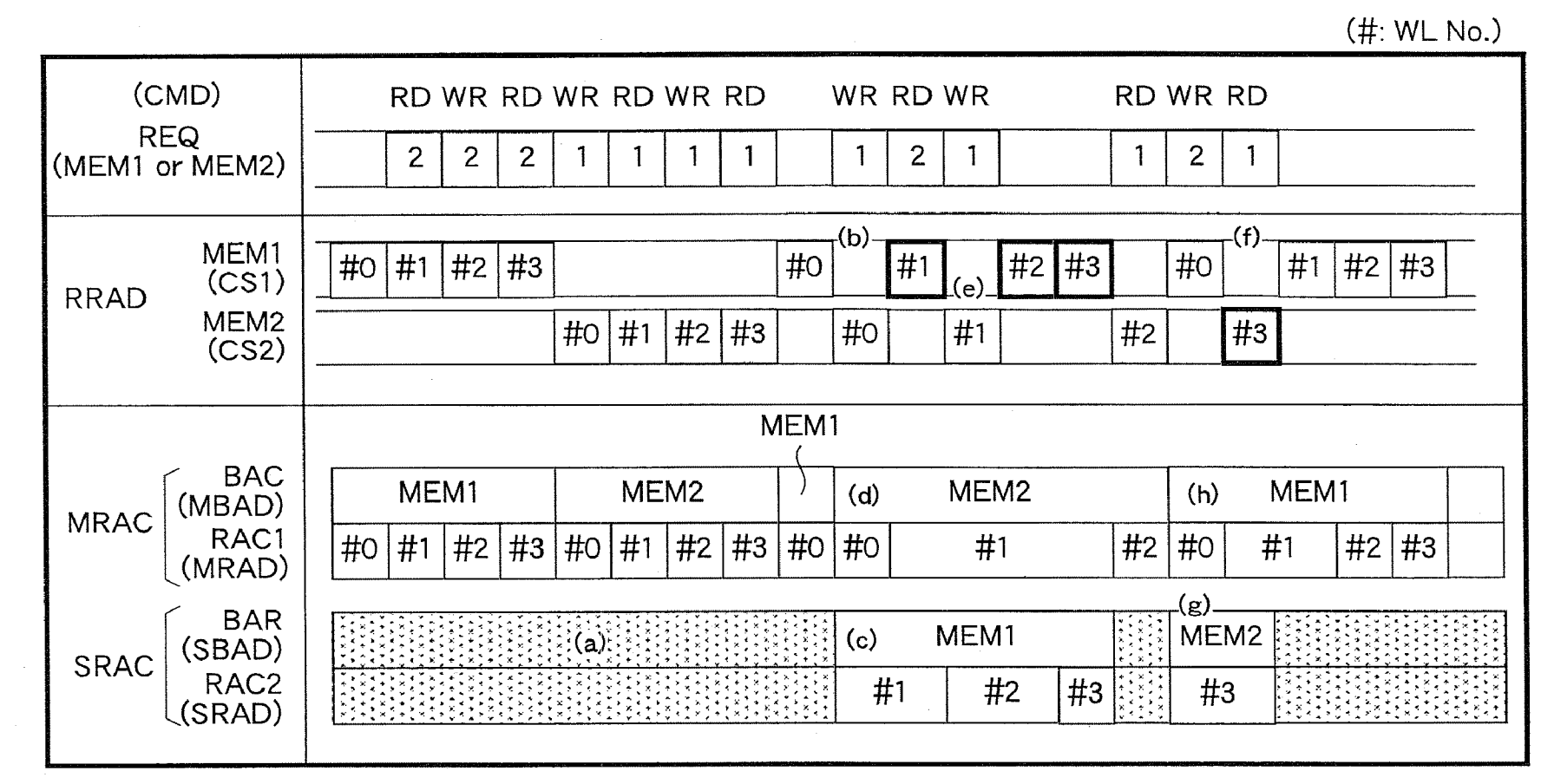

FIG. 20 illustrates an example of operations of the memory controller MCNT of the sixth embodiment. Detailed description of the same operations as those in FIGS. 6, 7 will be omitted. In this example, the description will be given on assumption that each of the memories MEM has four word lines WL0-WL3. What is different from FIGS. 6, 7 is that the memories MEM1-2 are accessed instead of the banks BK0-3. For easier understanding of the description, a generation cycle of the refresh request RREQ is set substantially equal to a supply cycle of the access request REQ (access commands RD, WR). Each numeral corresponding to the access request REQ on the upper side in FIG. 20 represents the number assigned to the accessed memory MEM (the number assigned to the chip select signal CS).

Up to the ninth refresh operation (MEM1, #0), since the accessed memory MEM1 or MEM2 does not coincide with the refreshed memory MEM1 or MEM2, a sub refresh address counter SRAC is not used and is kept invalid (FIG. 20 (a)). A refresh operation to be executed tenthly (MEM1, #1) conflicts with an access operation (MEM1, WR) (FIG. 20 (b)). Therefore, values of a main refresh address counter MRAC are transferred to the sub refresh address counter SRAC (FIG. 20 (c)). The values of the main refresh address counter MRAC are updated to values indicating MEM2, #0 (FIG. 20 (d)). Then, a refresh operation of the memory MEM2 is executed by using the main refresh address counter MRAC simultaneously with a write operation WR of the memory MEM1. Thereafter, the refresh operation is executed by using the sub refresh address counter SRAC with higher priority (FIG. 20 (e)).

The final read operation RD (MEM1) conflicts with a refresh operation to be executed (MEM1, #1) (FIG. 20 (f)). Therefore, the values of the main refresh address counter MRAC are transferred to the sub refresh address counter SRAC (FIG. 20 (g)). The values of the main refresh address counter MRAC are updated to values indicating MEM1, #0 (FIG. 20 (h)). Then, the refresh operation of the memory MEM1 is executed by using the main refresh address counter MRAC simultaneously with the read operation RD of the memory MEM1.

The sixth embodiment described above can provide the same effects as those of the above-described first embodiment. In addition, applying this embodiment to the memory controller MCNT makes it possible to always simultaneously execute the refresh operation and the access operation by changing the memory MEM in which the refresh operation is executed, even if the access operation (the read operation or the write operation) and the refresh operation conflict with each other in the same one of the memories MEM1-2. That is, it is possible to continuously supply access requests to the memories MEM1-2 without influenced by the refresh operation. It is possible to supply the refresh command REF to the memory MEM in response to the refresh request without any influence from the access operation. As a result, in the memory controller MCNT controlling the operations of the memories MEM1-2, it is possible to execute the refresh operation with a minimum increase in circuit scale and without any deterioration in access efficiency.

Further, the refresh operation corresponding to the values held in the sub refresh address counter SRAC is executed with higher priority, as in the first embodiment. This can prevent the execution sequence of the refresh operation from greatly varying and suppress an increase in an interval of the refresh operation in memory cells of each of the memories MEM. As a result, deterioration in data retention characteristic of the memory cells can be prevented, enabling improved reliability of the memories MEM and the system SYS.

Figure 21:
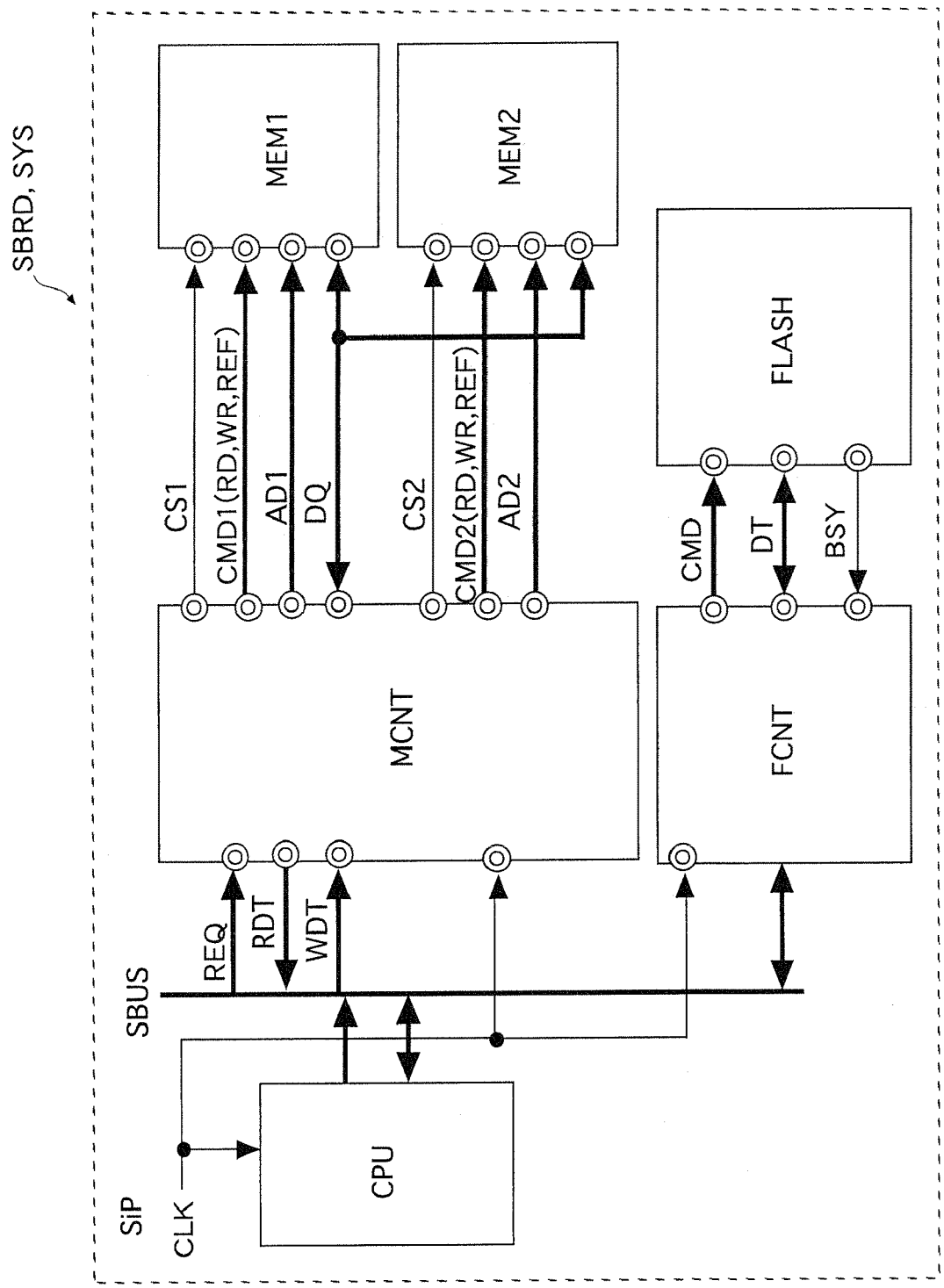
FIG. 21 illustrates a system of a seventh embodiment.

FIG. 21 illustrates a system of a seventh embodiment. The same reference numerals and symbols are used to designate the same elements as the elements described in the first and third embodiments, and detailed description thereof will be omitted. A memory controller MCNT of this embodiment has independent address terminals AD1, AD2 corresponding to memories MEM1-2 respectively. A system board SBRD has address signal lines AD1, AD2 coupling the address terminals AD1, AD2 to address terminals of the memories MEM1-2 respectively. The other configuration is the same as that of the sixth embodiment (FIG. 18). That is, the system is, for example, a portable equipment such as a mobile phone. Each of the memories MEM1-2 is, for example, a SDRAM type FCRAM (Fast Cycle RAM). To simplify the description, the description of a clock signal is omitted.

Figure 22:
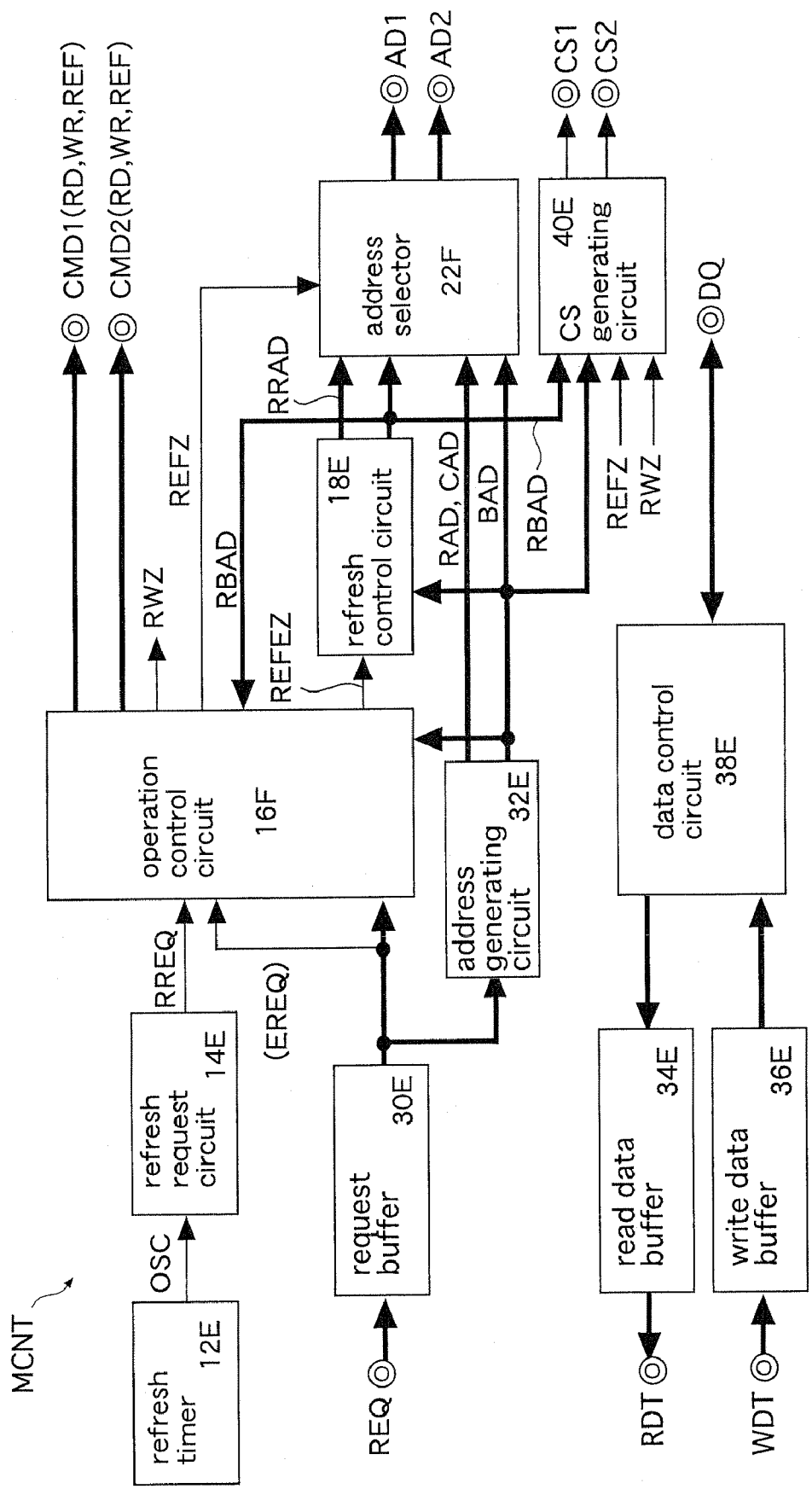
FIG. 22 illustrates details of a memory controller illustrated in FIG. 21.

FIG. 22 illustrates details of the memory controller MCNT illustrated in FIG. 21. The same reference numerals and symbols are used to designate the same elements as the elements in FIG. 19, and detailed description thereof will be omitted. In this embodiment, an operation control circuit 16F and an address selector 22F are disposed in place of the operation control circuit 16E and the address selector 22E of the memory controller MCNT of the third embodiment. The other configuration of the memory controller MCNT is the same as that of the third embodiment (FIG. 19).

The operation control circuit 16F does not have the access priority circuit APR arbitrating between an access request EREQ and a refresh request RREQ. The operation control circuit 16F activates a read/write signal RWZ in synchronization with the access request EREQ (RD, WR) and activates a refresh signal REFZ in synchronization with the refresh request RREQ, without performing arbitration.

The address selector 22F outputs access addresses RAD, CAD to the address signal line AD1 or AD2 corresponding to the memory MEM1 or MEM2 selected based on a block address BAD, in synchronization with the read/write signal RWZ. Further, the address selector 22F outputs a refresh row address RRAD to the address signal line AD1 or AD2 corresponding to the memory MEM1 or MEM2 selected based on a refresh block address RBAD, in synchronization with the refresh signal REFZ.

In this embodiment, the address signal lines AD1-2 are independently laid in correspondence to the memories MEM1-2. Therefore, the memory controller MCNT can supply an access command RD, WR (CMD1-2) and a refresh command REF simultaneously to the memories MEM1-2 and can supply addresses AD1-2 corresponding to these commands RD, WR, REF simultaneously to the memories MEM1-2. Therefore, as in the second embodiment (FIG. 11), when the access request and the refresh request conflict with each other, an access operation can be executed without any influence from a refresh operation, and the refresh operation can be executed without any influence from the access operation. This embodiment described above can provide the same effects as those of the first, second, and third embodiments.

The foregoing describes the examples where the first, second, third, fourth, and fifth embodiments are applied to the pseudo SRAM type FCRAM. This is not restrictive, and the above-described embodiments may be applied to a different-type semiconductor memory which has a plurality of banks operating independently and in which a refresh request internally generated in a memory device and an external access request conflict with each other. Further, the above-described embodiments may be applied to a DRAM or a SDRAM having a refresh terminal REF.

The foregoing describes the examples where the first and second embodiments are applied to the semiconductor memory having the banks BK0-3 capable of independently operating. This is not restrictive, and for example, the first and second embodiments may be applied to a semiconductor memory having a plurality of memory blocks capable of independently operating. Here, each of the memory blocks includes sense amplifiers capable of independently operating and simultaneously holding different data.

The foregoing describes the examples where the sixth and seventh embodiments are applied to the memory controller MCNT and the system SYS accessing the plural SDRAM type FCRAMs. This is not restrictive, and for example, the sixth and seventh embodiments may be applied to a memory controller MCNT and a system SYS accessing a clock asynchronous type DRAM.

The above embodiments describe the examples where the main refresh address counter MRAC and the sub refresh address counter SRAC count up. This is not restrictive, and for example, the counters MRAC, SRAC may count down.

The above embodiments describe the examples where the system in package SiP is mounted on the system board SBRD to form the system SYS. This is not restrictive, and for example, with the CPU and the memory MEM, or the CPU, the memory controller MCNT, and the memories MEM1-2 being designed as a system LSI (SoC; System on Chip), the system board SBRD and a system LSI chip mounted thereon may form the system SYS.

A proposition of the embodiments is to execute a refresh operation with a minimum increase in circuit scale and without any deterioration in access efficiency.

According to one aspect of the embodiments, a semiconductor memory has a plurality of banks each having dynamic memory cells and capable of operating independently. A main refresh address counter updates a main block address held in itself in order to change a bank to be refreshed when the main block address coincides with an access address corresponding to an access request. Further, the main refresh address counter sequentially generates a main row address and a main block address in synchronization with a main count signal. A sub refresh address counter is set valid when the main block address coincides with the access address, and receives the main block address and the main row address, as a sub block address and a sub row address. The sub refresh address counter sequentially generates a sub row address in synchronization with a sub count signal and is set invalid after outputting a final sub row address.

An address selection circuit selects addresses not coinciding with the access address, out of the main block address and the main row address, and the sub block address and the sub row address, and outputs the selected addresses. A counter control circuit outputs, in response to a refresh request, one of the main count signal and the sub count signal corresponding to the addresses output by the address selection circuit. A refresh counter control circuit controls operations of the main refresh address counter, the sub refresh address counter, the address selection circuit, and the counter control circuit, and makes the sub refresh address counter operate with priority over the main refresh address counter during a period in which the sub refresh address counter is valid. An operation control circuit executes an access operation of one of the banks in response to the access request and executes a refresh operation of one of the banks in response to the refresh request. This structure enables the simultaneous execution of the access operation and the refresh operation with a simple circuit. It is possible to continuously receive an access request to execute the access operation, without any influence from the refresh operation. Further, it is possible to execute the refresh operation in response to the refresh request, without any influence from the access operation. That is, the access operation and the refresh operation can be simultaneously executed without any mutual interference. As a result, it is possible to execute the refresh operation with a minimum increase in circuit scale and without any deterioration in access efficiency.

When the main block address and the main row address are transferred from the main refresh address counter to the sub refresh address counter, the refresh operation is executed by using the sub refresh address counter with higher priority. That is, when the sub refresh address counter is used, the refresh operation of a bank designated most recently by the main refresh address counter is executed with higher priority. This structure can prevent the execution sequence of the refresh operation from greatly varying even when the main block address coincides with the access address. Therefore, it is possible to suppress an increase in an interval of the refresh operation in each of the memory cells. As a result, deterioration in data retention characteristic of the memory cells can be prevented, enabling improved reliability of the semiconductor memory.

According to another aspect of the embodiment, a system has: a plurality of semiconductor memories each having dynamic memory cells; a system controller outputting an access request to the semiconductor memories; and a memory controller controlling operations of the semiconductor memories in response to a refresh request and an access request. The memory controller has: a refresh request generation circuit periodically outputting the refresh request; and the main refresh address counter, the sub refresh address counter, the address selection circuit, the counter control circuit, and the refresh counter control circuit which are described in the first embodiment.

An operation control circuit of the memory controller outputs an access control signal in response to the access request in order to execute an access operation of one of the semiconductor memories. Further, the operation control circuit outputs a refresh control signal in response to the refresh request in order to execute a refresh operation of one of the semiconductor memories. Consequently, with a simple circuit, the access operation of one of the semiconductor memories and the refresh operation of another of the semiconductor memories can be simultaneously executed. The access request can be continuously supplied to the semiconductor memories without any influence from the refresh operation. Further, the refresh operation can be executed in response to the refresh request without any influence from the access operation. As a result, in the memory controller controlling the operations of the plural semiconductor memories, it is possible to execute the refresh operation with a minimum increase in circuit scale and without any deterioration in access efficiency.

As in the one aspect of the embodiments described above, even when the main block address coincides with the access address, the execution of the refresh operation which should have been executed by using the main refresh address counter follows with higher priority. This can prevent the execution sequence of the refresh operation from greatly varying even when the main block address coincides with the access address. Therefore, it is possible to suppress an increase in an interval of the refresh operation in the memory cells in each of the semiconductor memories. As a result, deterioration in data retention characteristic of the memory cells can be prevented, enabling improved reliability of the semiconductor memory and the system According to the above aspects, the sub use control circuit activates a sub use signal when the sub refresh address counter is to be used with higher priority. The counting by the main and sub refresh address counters and the selection by the address selection circuit are controlled according to logical level of the sub use signal, which makes it possible to form the refresh counter control circuit with a simple structure, enabling a reduction in circuit scale.

According to the above aspects, the sub refresh address counter is used with higher priority when the sub refresh address counter is valid. Therefore, a sub block address held in the sub refresh address counter need not be updated. Therefore, the sub refresh address counter can be formed by a sub row address counter and a sub block address register, which enables a reduction in circuit scale.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory which comprises a plurality of banks each having dynamic memory cells and operating independently, and operates in response to an access request, the semiconductor memory comprising:
    a main refresh address counter changing a main block address when the main block address coincides with an access block address corresponding to the access request, and sequentially generating a main row address and the main block address in synchronization with a main count signal;
    a sub refresh address counter set valid when the main block address coincides with the access block address, receiving, as a sub block address and a sub row address, the main block address and the main row address transferred from the main refresh address counter, sequentially generating the sub row address in synchronization with a sub count signal, and set invalid after outputting a final sub row address;
    an address selection circuit selecting addresses not coinciding with the access block address, out of the main block address and the main row address, and the sub block address and the sub row address, and outputting the selected addresses;
    a counter control circuit outputting, in response to a refresh request, one of the main count signal and the sub count signal corresponding to the addresses output by the address selection circuit;
    a refresh counter control circuit controlling operations of the main refresh address counter, the sub refresh address counter, the address selection circuit, and the counter control circuit, and making the sub refresh address counter operate with priority over the main refresh address counter during a period in which the sub refresh address counter is valid; and
    an operation control circuit executing an access operation of one of the banks in response to the access request and executing a refresh operation of one of the banks in response to the refresh request.

2. The semiconductor memory according to claim 1, wherein the refresh counter control circuit comprises:
    a main comparator activating a main coincidence signal when the main block address coincides with the access block address,
    a sub use control circuit activating a sub use signal in synchronization with the activation of the main coincidence signal and inactivating the sub use signal in response to completion of output of the final sub row address,
    a sub comparator activating a sub coincidence signal when the sub block address coincides with the access block address, and
    a sub address selection control circuit activating a sub address selection signal when the sub coincidence signal is inactivated while the sub use signal is active, wherein
    the address selection circuit outputs the sub block address and the sub row address while the sub address selection signal is active, and outputs the main block address and the main row address while the sub address selection signal is inactive, wherein
    the counter control circuit outputs the sub count signal while the sub address selection signal is active, and outputs the main count signal while the sub address selection signal is inactive.

3. The semiconductor memory according to claim 2, further comprising:
    a switch disposed between an output of the main refresh address counter and an input of the sub refresh address counter, and turning on in synchronization with the activation of the main coincidence signal while the sub use signal is inactive.

4. The semiconductor memory according to claim 1, wherein the main refresh address counter comprises:
    a main row address counter sequentially generating the main row address indicating the memory cell to be refreshed, in synchronization with the main count signal: and
    a main block address counter sequentially generating the main block address indicating the bank to be refreshed, in synchronization with a carry signal from the main row address counter,
    wherein the sub refresh address counter comprises:

a sub row address counter holding, as the sub row address, the main row address transferred from the main refresh address counter and sequentially updating the held sub row address in synchronization with the sub count signal: and a sub block address register holding, as the sub block address, the main block address transferred from the main refresh address counter and outputting the held sub block address.

5. The semiconductor memory according to claim 4, wherein a sequence of generating address by the main row address counter is the same as a sequence of generating address by the sub row address counter.

6. The semiconductor memory according to claim 1, wherein the main count signal and the sub count signal are generated in synchronization with a refresh end signal generated in response to completion of the refresh operation.

7. The semiconductor memory according to claim 1, further comprising:

a refresh request generation circuit periodically outputting the refresh request.

8. The semiconductor memory according to claim 1, further comprising:

a refresh terminal receiving the refresh request.

9. The semiconductor memory according to claim 1, further comprising:

an access control signal line through which an access control signal generated by the operation control circuit in response to the access request is transmitted to the banks; and a refresh control signal line through which a refresh control signal generated by the operation control circuit in response to the refresh request is transmitted to the banks.

10. The semiconductor memory according to claim 1, further comprising:

an access address signal line through which the access block address is supplied to the banks; and a refresh address signal line through which the main block address and the main row address, or the sub block address and the sub row address are supplied to the banks.

11. A system comprising a semiconductor memory including a plurality of banks each having dynamic memory cells and operating independently; and a controller outputting an access request to the semiconductor memory, wherein the semiconductor memory comprises:

a main refresh address counter changing a main block address when the held main block address coincides with an access block address corresponding to the access request, and sequentially generating a main row address and the main block address in synchronization with a main count signal;

a sub refresh address counter set valid when the main block address coincides with the access block address, receiving, as a sub block address and a sub row address, the main block address and the main row address transferred from the main refresh address counter, sequentially generating the sub row address in synchronization with a sub count signal, and set invalid after outputting a final sub row address;

an address selection circuit selecting addresses not coinciding with the access block address, out of the main block address and the main row address, and the sub block address and the sub row address, and outputting the selected addresses;

a counter control circuit outputting, in response to a refresh request, one of the main count signal and the sub count signal corresponding to the addresses output by the address selection circuit;

a refresh counter control circuit controlling operations of the main refresh address counter, the sub refresh address counter, the address selection circuit, and the counter control circuit, and making the sub refresh address counter operate with priority over the main refresh address counter during a period in which the sub refresh address counter is valid; and an operation control circuit executing an access operation of one of the banks in response to the access request and executing a refresh operation of one of the banks in response to the refresh request.

12. The system according to claim 11, wherein the refresh counter control circuit comprises:

a main comparator activating a main coincidence signal when the main block address coincides with the access block address;

a sub use control circuit activating a sub use signal in synchronization with the activation of the main coincidence signal and inactivating the sub use signal in response to completion of output of the final sub row address;

a sub comparator activating a sub coincidence signal when the sub block address coincides with the access block address; and a sub address selection control circuit activating a sub address selection signal when the sub coincidence signal is inactivated while the sub use signal is active, wherein the address selection circuit outputs the sub block address and the sub row address while the sub address selection signal is active, and outputs the main block address and the main row address while the sub address selection signal is inactive, wherein the counter control circuit outputs the sub count signal while the sub address selection signal is active, and outputs the main count signal while the sub address selection signal is inactive.

13. The system according to claim 12, further comprising:

a switch disposed between an output of the main refresh address counter and an input of the sub refresh address counter, and turning on in synchronization with the activation of the main coincidence signal while the sub use signal is inactive.

14. The system according to claim 11, wherein:

the main refresh address counter comprises:

a main row address counter sequentially generating the main row address indicating the memory cell to be refreshed, in synchronization with the main count signal; and a main block address counter sequentially generating the main block address indicating the bank to be refreshed, in synchronization with a carry signal from the main row address counter wherein the sub refresh address counter comprises:

a sub row address counter holding, as the sub row address, the main row address transferred from the main refresh address counter and sequentially updating the held sub row address in synchronization with the sub count signal; and a sub block address register holding, as the sub block address, the main block address transferred from the main refresh address counter and outputting the held sub block address.

15. The system according to claim 14, wherein a sequence of generating address by the main row address counter is the same as a sequence of generating address by the sub row address counter.

16. The system according to claim 11, wherein the main count signal and the sub count signal are generated in synchronization with a refresh end signal generated in response to completion of the refresh operation.

17. The system according to claim 11, further comprising: a refresh request generation circuit periodically outputting the refresh request.

18. The system according to claim 11, wherein: the semiconductor memory includes a refresh terminal receiving the refresh request; and the controller outputs the refresh request.

19. The system according to claim 11, wherein the semiconductor memory, further comprises:
an access control signal line through which an access control signal generated by the operation control circuit in response to the access request is transmitted to the banks; and
a refresh control signal line through which a refresh control signal generated by the operation control circuit in response to the refresh request is transmitted to the banks.

20. The system according to claim 11, wherein the semiconductor memory, further comprises:
an access address signal line through which the access block address is supplied to the banks; and
a refresh address signal line through which the main block address and the main row address, or the sub block address and the sub row address are supplied to the banks.

21. An operating method of a semiconductor memory which comprises a plurality of banks each having dynamic memory cells and operating independently and operates in response to an access request and a refresh request, the method comprising:
changing a main block address held in a main refresh address counter when the main block address coincides with an access block address corresponding to the access request;
sequentially generating a main row address and the main block address in synchronization with a main count signal;
setting a sub refresh address counter valid when the main block address coincides with the access block address;
transferring the main block address and the main row address from the main refresh address counter to the sub refresh address counter;
sequentially generating a sub row address in synchronization with a sub count signal;
setting the sub refresh address counter invalid after outputting a final sub row address;
selecting addresses not coinciding with the access block address, out of the main block address and the main row address, and the sub block address and the sub row address, and outputting the selected addresses;
outputting, in response to a refresh request, one of the main count signal and the sub count signal corresponding to the selected addresses output to the banks;
making the sub refresh address counter operate with priority over the main refresh address counter during a period in which the sub refresh address counter is valid;
executing an access operation of one of the banks in response to the access request; and
in parallel to the execution of the access operation of one of the banks in response to the access request, executing a refresh operation of a bank different from the bank in which the access operation is executed, when the access request conflicts with the refresh request.

22. The operating method of the semiconductor memory according to claim 21, further comprising:
activating a main coincidence signal when the main block address coincides with the access block address;
activating a sub use signal in synchronization with the activation of the main coincidence signal;
inactivating the sub use signal in response to completion of output of the final sub row address;
activating a sub coincidence signal when the sub block address coincides with the access block address;
activating a sub address selection signal only when the sub coincidence signal is inactivated while the sub use signal is active;
outputting the sub block address and the sub row address while the sub address selection signal is active, and outputting the main block address and the main row address while the sub address selection signal is inactive; and
outputting the sub count signal while the sub address selection signal is active, and outputting the main count signal while the sub address selection signal is inactive.

23. The operating method of the semiconductor memory according to claim 21, further comprising
making the main refresh address counter sequentially update the main row address indicating memory cells to be refreshed, in synchronization with the main count signal, and sequentially update the main block address indicating the bank to be refreshed, in synchronization with a carry signal from the main row address counter; and
making the sub refresh address counter hold, as the sub row address, the main row address transferred from the main refresh address counter to sequentially update the held sub row address in synchronization with the sub count signal, and hold, as the sub block address, the main block address transferred from the main refresh address counter to output the held sub block address.

24. The operating method of the semiconductor memory according to claim 21, wherein
the main count signal and the sub count signal are generated in synchronization with a refresh end signal generated in response to completion of the refresh operation.

25. The operating method of the semiconductor memory according to claim 21, further comprising
supplying the banks with an access control signal generated in response to the access request simultaneously with a refresh control signal generated in response to the refresh request signal, when the access request and the refresh request conflict with each other.

26. A memory controller controlling operations of a plurality of semiconductor memories each having dynamic memory cells, in response to an access request from a system controller and a refresh request, the memory controller comprising:
a refresh request generation circuit periodically outputting the refresh request;

a main refresh address counter changing a main block address held in the main refresh address counter, when the main block address coincides with an access block address corresponding to the access request, and sequentially generating a main row address and the main block address in synchronization with a main count signal;

a sub refresh address counter set valid when the main block address coincides with the access block address, receiving, as a sub block address and a sub row address, the main block address and the main row address transferred from the main refresh address counter, sequentially generating the sub row address in synchronization with a sub count signal, and set invalid after outputting a final sub row address;

an address selection circuit selecting addresses not coinciding with the access block address, out of the main block address and the main row address, and the sub block address and the sub row address, and outputting the selected addresses;

a counter control circuit outputting, in response to a refresh request, one of the main count signal and the sub count signal corresponding to the addresses output by the address selection circuit;

a refresh counter control circuit controlling operations of the main refresh address counter, the sub refresh address counter, the address selection circuit, and the counter control circuit, and making the sub refresh address counter operate with priority over the main refresh address counter during a period in which the sub refresh address counter is valid; and an operation control circuit outputting an access control signal in response to the access request, and outputting a refresh control signal in response to the refresh.

27. The memory controller according to claim 26, wherein the refresh counter control circuit comprises:

a main comparator activating a main coincidence signal when the main block address coincides with the access block address, a sub use control circuit activating a sub use signal in synchronization with the activation of the main coincidence signal and inactivating the sub use signal in response to completion of output of the final sub row address, a sub comparator activating a sub coincidence signal when the sub block address coincides with the access block address, and a sub address selection control circuit activating a sub address selection signal only when the sub coincidence signal is inactivated while the sub use signal is active, wherein the address selection circuit outputs the sub block address and the sub row address while the sub address selection signal is active, and outputs the main block address and the main row address while the sub address selection signal is inactive; and the counter control circuit outputs the sub count signal while the sub address selection signal is active, and outputs the main count signal while the sub address selection signal is inactive.

28. The memory controller according to claim 26, wherein:
the main refresh address counter comprises
a main row address counter sequentially generating the main row address indicating the memory cell to be refreshed, in synchronization with the main count signal, and a main block address counter sequentially generating the main block address indicating the bank to be refreshed, in synchronization with a carry signal from the main row address counter; and the sub refresh address counter comprises a sub row address counter holding, as the sub row address, the main row address transferred from the main refresh address counter and sequentially updating the held sub row address in synchronization with the sub count signal, and a sub block address register holding, as the sub block address, the main block address transferred from the main refresh address counter and outputting the held sub block address.

29. The memory controller according to claim 26, wherein the main count signal and the sub count signal are generated in synchronization with a refresh end signal generated in response to completion of the refresh operation.

30. A system comprising a plurality of semiconductor memories each having dynamic memory cells; a system controller outputting an access request to the semiconductor memories; and a memory controller controlling operations of the semiconductor memories in response to a refresh request and the access request, wherein the memory controller comprises:

a refresh request generation circuit periodically outputting the refresh request;

a main refresh address counter changing a main block address held in the main refresh address counter, when the main block address coincides with an access block address corresponding to the access request, and sequentially generating the main row address and a main block address in synchronization with a main count signal;

a sub refresh address counter set valid when the main block address coincides with the access block address, receiving, as a sub block address and a sub row address, the main block address and the main row address transferred from the main refresh address counter, sequentially generating the sub row address in synchronization with a sub count signal, and set invalid after outputting a final sub row address;

an address selection circuit selecting addresses not coinciding with the access block address, out of the main block address and the main row address, and the sub block address and the sub row address, and outputting the selected addresses;

a counter control circuit outputting, in response to a refresh request, one of the main count signal and the sub count signal corresponding to the addresses output by the address selection circuit;

a refresh counter control circuit controlling operations of the main refresh address counter, the sub refresh address counter, the address selection circuit, and the counter control circuit, and making the sub refresh address counter operate with priority over the main refresh address counter during a period in which the sub refresh address counter is valid; and an operation control circuit outputting an access control signal in response to the access request, and outputting a refresh control signal in response to the refresh.

31. The system according to claim 30, wherein the refresh counter control circuit comprises:

a main comparator activating a main coincidence signal when the main block address coincides with the access block address, a sub use control circuit activating a sub use signal in synchronization with the activation of the main coincidence signal and inactivating the sub use signal in response to completion of output of the final sub row address, a sub comparator activating a sub coincidence signal when the sub block address coincides with the access block address, and a sub address selection control circuit activating a sub address selection signal when the sub coincidence signal is inactivated while the sub use signal is active, wherein the address selection circuit outputs the sub block address and the sub row address while the sub address selection signal is active, and outputs the main block address and the main row address while the sub address selection signal is inactive; and the counter control circuit outputs the sub count signal while the sub address selection signal is active, and outputs the main count signal while the sub address selection signal is inactive.

32. The system according to claim 30, wherein:

the main refresh address counter comprises a main row address counter sequentially generating the main row address indicating the memory cell to be refreshed, in synchronization with the main count signal, and a main block address counter sequentially generating the main block address indicating the bank to be refreshed, in synchronization with a carry signal from the main row address counter; and the sub refresh address counter comprises a sub row address counter holding, as the sub row address, the main row address transferred from the main refresh address counter and sequentially updating the held sub row address in synchronization with the sub count signal, and a sub block address register holding, as the sub block address, the main block address transferred from the main refresh address counter and outputting the held sub block address.

33. The system according to claim 30, wherein the main count signal and the sub count signal are generated in synchronization with a refresh end signal generated in response to completion of the refresh operation.

* * * * *